(12) United States Patent
Kim et al.

(10) Patent No.: US 10,763,111 B2
(45) Date of Patent: Sep. 1, 2020

(54) POLYHEDRON OF WHICH UPPER WIDTH IS NARROWER THAN LOWER WIDTH, MANUFACTURING METHOD THEREFOR, AND PHOTOELECTRIC CONVERSION DEVICE COMPRISING SAME

(71) Applicant: Industry-University Cooperation Foundation Hanyang University, Seoul (KR)

(72) Inventors: Dong Rip Kim, Seoul (KR); Hanmin Jang, Seoul (KR); Min Soo Jeon, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 257 days.

(21) Appl. No.: 15/325,523

(22) PCT Filed: Jul. 14, 2015

(86) PCT No.: PCT/KR2015/007293
§ 371 (c)(1),
(2) Date: Jan. 11, 2017

(87) PCT Pub. No.: WO2016/010339
PCT Pub. Date: Jan. 21, 2016

(65) Prior Publication Data
US 2017/0162748 A1      Jun. 8, 2017

(30) Foreign Application Priority Data

Jul. 14, 2014 (KR) .......................... 10-2014-0088471
Oct. 20, 2014 (KR) .......................... 10-2014-0142018
Oct. 20, 2014 (KR) .......................... 10-2014-0142019

(51) Int. Cl.
*H01L 31/02* (2006.01)
*H01L 31/08* (2006.01)
(Continued)

(52) U.S. Cl.
CPC .. *H01L 21/02609* (2013.01); *H01L 21/02636* (2013.01); *H01L 31/04* (2013.01);
(Continued)

(58) Field of Classification Search
CPC . H01L 31/04; H01L 31/182; H01L 21/02609; H01L 21/02636; H01L 33/08; H01L 33/18
See application file for complete search history.

(56) References Cited

U.S. PATENT DOCUMENTS

2012/0085397 A1    4/2012  Kim et al.
2013/0214251 A1*   8/2013  Balkenende ........ H01L 21/0237
                                                    257/13
(Continued)

FOREIGN PATENT DOCUMENTS

KR    10-2008-0085519 A    9/2008
KR    10-2012-0037069 A    4/2012
(Continued)

OTHER PUBLICATIONS

International Search Report for application No. PCT/KR2015/007293 dated Oct. 15, 2015.

*Primary Examiner* — Matthew T Martin
(74) *Attorney, Agent, or Firm* — Sughrue Mion, PLLC

(57) ABSTRACT

Provided are a polyhedron of which the upper width is narrower than the lower width, a manufacturing method therefor, and a photoelectric conversion device comprising the same. The photoelectric conversion device comprises: a substrate; a polyhedron disposed on the substrate and of which the upper width is narrower than the lower width; and
(Continued)

a semiconductor layer disposed on the polyhedron. The photoelectric conversion device to which the polyhedron, of which the upper width is narrower than the lower width, is applied can have improved photoelectric conversion efficiency due to structural characteristics of the polyhedron.

17 Claims, 21 Drawing Sheets

(51) Int. Cl.
    *H01L 21/02*     (2006.01)
    *H01L 31/18*     (2006.01)
    *H01L 33/18*     (2010.01)
    *H01L 31/04*     (2014.01)
    *H01L 33/08*     (2010.01)

(52) U.S. Cl.
    CPC ............ *H01L 31/182* (2013.01); *H01L 33/08* (2013.01); *H01L 33/18* (2013.01)

(56) References Cited

U.S. PATENT DOCUMENTS

| | | | |
|---|---|---|---|
| 2013/0220406 A1* | 8/2013 | Day | ................. H01L 31/03528 |
| | | | 136/255 |
| 2014/0231748 A1 | 8/2014 | Kim et al. | |
| 2016/0005892 A1* | 1/2016 | Yu | .................... H01L 31/03529 |
| | | | 136/255 |

FOREIGN PATENT DOCUMENTS

| | | |
|---|---|---|
| KR | 10-2012-0077612 A | 7/2012 |
| KR | 10-2014-0023754 A | 2/2014 |

* cited by examiner

POLYHEDRON OF WHICH UPPER WIDTH IS NARROWER THAN LOWER WIDTH, MANUFACTURING METHOD THEREFOR, AND PHOTOELECTRIC CONVERSION DEVICE COMPRISING SAME

CROSS REFERENCE TO RELATED APPLICATIONS

This application is a National Stage of International Application No. PCT/KR2015/007293, filed on Jul. 14, 2015, which claims priority from Korean Patent Application Nos. 10-2014-0088471, filed on Jul. 14, 2014, 10-2014-0142018, filed on Oct. 20, 2014, and 10-2014-0142019, filed on Oct. 20, 2014, the contents of all of which are incorporated herein by reference in their entirety.

TECHNICAL FIELD

The present invention relate to a semiconductor device and more specifically to a photoelectric conversion device.

BACKGROUND ART

A photoelectric conversion device refers to a device that can convert light energy into electric energy or convert electric energy into light energy. Examples of such a photoelectric conversion device include a solar cell for converting solar energy into electric energy and a light-emitting diode for converting electric energy into light energy.

Research on use of nanowires to improve efficiency of such a photoelectric conversion device has been conducted (in Japanese Patent Application Laid-Open No. 2009-59740). However, it is known that efficiency improvement of a photoelectric conversion device using nanowires is not satisfied.

DISCLOSURE

Technical Problem

The present invention is directed to providing a photoelectric conversion device having improved photoelectric conversion efficiency.

Technical Solution

One aspect of the present invention provides a photoelectric conversion device. The photoelectric conversion device includes a substrate. A polyhedron of which an upper width is smaller than a lower width is disposed on the substrate. A semiconductor layer is disposed on the polyhedron.

The polyhedron may include a plurality of crystal facets. An angle formed by each of the crystal facets of the polyhedron and a surface of the substrate may be reduced toward an upper portion of the polyhedron. The polyhedron may have a sharp vertex or edge at a top thereof. The polyhedron may be a polyhedron having crystallinity and the semiconductor layer may be an epitaxial layer. A thickness of the semiconductor layer may be smaller than a height of the polyhedron.

The polyhedron may have a first conductive type, the semiconductor layer may have a second conductive type, a first electrode may be electrically connected to the first conductive-type polyhedron, and a second electrode may be electrically connected to the second conductive-type semiconductor layer.

The polyhedron may be a crystalline silicon polyhedron, and the semiconductor layer may be a silicon epitaxial layer. The semiconductor layer may include a first conductive-type semiconductor layer, an active layer, and a second conductive-type semiconductor layer, a first electrode may be electrically connected to the first conductive-type semiconductor layer, and a second electrode may be electrically connected to the second conductive-type semiconductor layer. The first conductive-type semiconductor layer, the active layer, and the second conductive-type semiconductor layer may be compound semiconductor layers.

Another aspect of the present invention provides a solar cell. The solar cell includes a substrate. A first conductive-type polyhedron of which an upper width is smaller than a lower width is disposed on the substrate. A second conductive-type semiconductor layer is disposed on the first conductive-type polyhedron. A first electrode is electrically connected to the first conductive-type polyhedron. A second electrode is electrically connected to the second conductive-type semiconductor layer.

The first conductive-type polyhedron may be a crystalline silicon polyhedron and the second conductive-type semiconductor layer may be a silicon epitaxial layer. The first conductive-type polyhedron may include a plurality of crystal facets. An angle formed by each of the crystal facets of the first conductive-type polyhedron and a surface of the substrate may be reduced toward an upper portion of the first conductive-type polyhedron. The first conductive-type polyhedron may have a sharp vertex or edge at a top thereof. A thickness of the second conductive-type semiconductor layer may be smaller than a height of the first conductive-type polyhedron.

Still another aspect of the present invention provides a light-emitting diode. The light-emitting diode includes a substrate. A polyhedron of which an upper width is smaller than a lower width is disposed on the substrate. A first conductive-type semiconductor layer, an active layer, and a second conductive-type semiconductor layer are sequentially disposed on the polyhedron. A first electrode is electrically connected to the first conductive-type semiconductor layer. A second electrode is electrically connected to the second conductive-type semiconductor layer.

The first conductive-type semiconductor layer, the active layer, and the second conductive-type semiconductor layer may be compound semiconductor layers. The polyhedron may be a crystalline silicon polyhedron, and the first conductive-type semiconductor layer, the active layer, and the second conductive-type semiconductor layer may be epitaxial layers.

The polyhedron may include a plurality of crystal facets. The polyhedron may be a silicon polyhedron and include four {111} facets and a sharp vertex in which the four {111} facets meet on an upper portion thereof. The first conductive-type semiconductor layer may be a GaN layer grown in a [0002] direction. An angle formed by each of the crystal facets of the polyhedron and a surface of the substrate may be reduced toward an upper portion of the polyhedron. The polyhedron may have a sharp vertex or edge at a top thereof. A total thickness of the first conductive-type semiconductor layer, the active layer, and the second conductive-type semiconductor layer may be smaller than a height of the polyhedron.

Yet another aspect of the present invention provides a photoelectric conversion device. The photoelectric conversion device includes a substrate. A polyhedron including a plurality of crystal facets is disposed on the substrate. A semiconductor layer is disposed on the polyhedron.

An angle formed by each of the crystal facets of the polyhedron and a surface of the substrate may be reduced toward an upper portion of the polyhedron. The polyhedron may be a polyhedron having crystallinity and the semiconductor layer may be an epitaxial layer. A thickness of the semiconductor layer may be smaller than a height of the polyhedron.

Yet another aspect of the present invention provides a method of manufacturing a crystalline polyhedron. First, a crystalline substrate is provided. A pillar is formed by etching the crystalline substrate. A crystalline polyhedron is formed by epitaxially growing a semiconductor layer on the pillar.

Hydrogen annealing may be performed on the pillar before the semiconductor layer is epitaxially grown. The etching of the pillar may be performed using anisotropic etching. The etching of the pillar may further include performing isotropic etching after the anisotropic etching is performed.

The substrate may be a single crystalline silicon substrate. The semiconductor layer may be a silicon layer. The substrate may be a substrate grown in a <100> direction, a <110> direction, or a <111> direction. For example, the substrate may be a substrate grown in a <100> direction and the semiconductor layer may be epitaxially grown.

Advantageous Effects

As described above, according to the present invention, a photoelectric conversion device to which a polyhedron of which an upper width is smaller than a lower width is applied can have improved photoelectric conversion efficiency due to structural characteristics of the polyhedron.

MODES OF THE INVENTION

Figure 1:
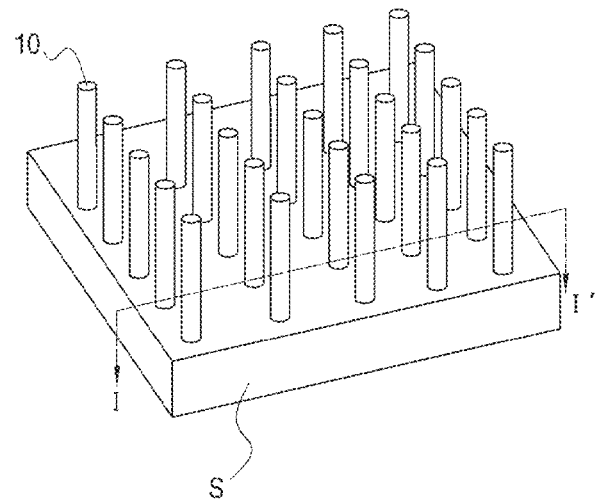
FIGS. 1, 3, and 5 are perspective views illustrating respective processes in a method of manufacturing a crystalline polyhedron according to one example embodiment of the present invention.

Hereinafter, in order to explain the present invention more specifically, example embodiments of the present invention will be described in more detail with reference to the accompanying drawings. However, the present invention is not limited to the example embodiments described herein and may be embodied in other forms. In the drawings, when a layer is referred to as being disposed "on" another layer or a substrate, the layer may be directly formed on the other layer or the substrate, or a third layer may be interposed therebetween.

Figure 2:
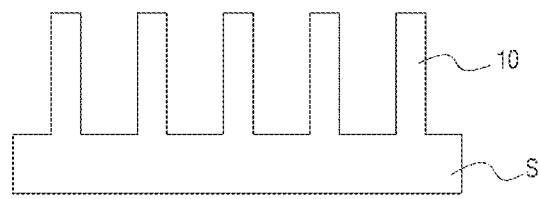
FIGS. 2, 4, and 6 are cross-sectional views taken along lines I-I' of FIGS. 1, 3, and 5, respectively.
Figure 3:
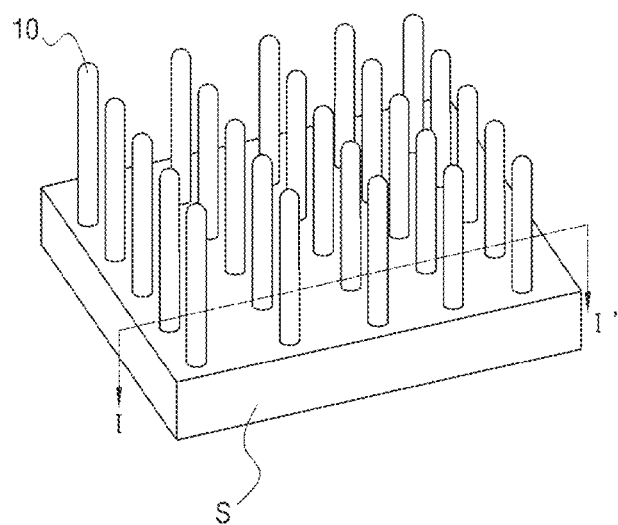
Figure 4:
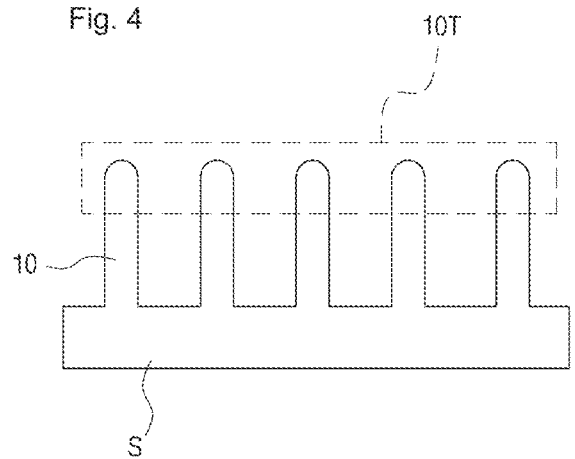
Figure 5:
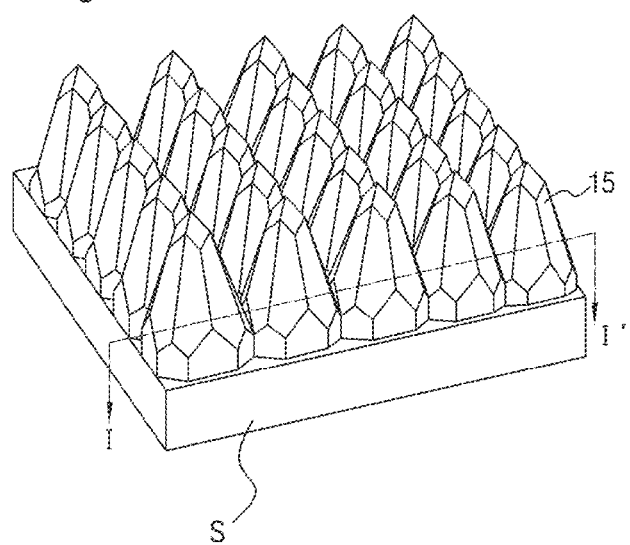
Figure 6:
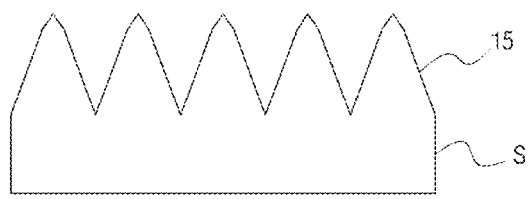

FIGS. 1, 3, and 5 are perspective views illustrating respective processes in a method of manufacturing a crystalline polyhedron according to one example embodiment of the present invention. FIGS. 2, 4, and 6 are cross-sectional views taken along lines I-I' of FIGS. 1, 3, and 5, respectively.

Referring to FIGS. 1 and 2, a substrate S may be provided. The substrate S may be a crystalline substrate, specifically, a single crystalline substrate, and more specifically, a single crystalline semiconductor substrate. For example, the substrate S may be a single crystalline silicon substrate.

The substrate S may be etched to form a plurality of pillars 10 regularly arranged. The etching of the substrate S may be performed using photolithography and dry etching. The dry etching may be reactive ion etching (RIE) in which anisotropic etching may be performed. Each of the pillars 10 may have a height in a vertical direction greater than a width in a horizontal direction, that is, an aspect ratio greater than 1. For example, the aspect ratio of the pillar 10 may range from 1 to 30. Various types of crystal facets may be exposed to side surfaces of the pillars 10 formed by the dry etching.

Then, isotropic dry etching may be additionally performed on the substrate S on which the pillars 10 are formed. In this case, diameters of the pillars 10 may be reduced and the side surfaces thereof may have slightly inclined surfaces. Also, since outer peripheral portions of the pillars 10 may be more rounded, more various types of crystal facets may be exposed.

Referring to FIGS. 3 and 4, hydrogen annealing may be performed on the pillars 10. In this case, the hydrogen annealing may refer to thermal annealing in a hydrogen atmosphere. The hydrogen annealing may be performed at a pressure ranging from about 10 Torr to about 100 Torr and a temperature ranging from about 800° C. to about 1,200° C. for about 1 minute to 30 minutes. More specifically, the hydrogen annealing may be performed at a pressure ranging from about 20 Torr to 60 Torr and a temperature ranging from about 1,000° C. to 1,100° C. for about 1 minute to 10 minutes.

Edges of the pillars 10 may be etched using such hydrogen annealing, and thus the pillars 10 may have rounded edges 10T. However, the hydrogen annealing is not a necessary process and may be omitted when the pillars 10 are formed thin to have a sufficiently narrow upper surface.

Referring to FIGS. 5 and 6, a semiconductor layer may be epitaxially grown on the substrate S including the pillars 10 and crystalline polyhedrons 15 may be formed. Each of the crystalline polyhedron 15 may have a structure surrounded by a plurality of different crystal facets and have a smaller upper width than a lower width. Specifically, an angle formed by each of the facets of the crystalline polyhedron 15 and a surface of the substrate S may be reduced toward an upper portion of the crystalline polyhedron 15. Such a crystalline polyhedron 15 may be formed due to different growth rates of the crystal facets in an epitaxial process, and thus the crystal facet having the slowest growth rate for each region may remain on the surface thereof.

The semiconductor layer may include the same material as or a different material from materials of the pillars 10. In other words, the semiconductor layer may be homoepitaxially grown or heteroepitaxially grown on the pillars 10. Specifically, all of the semiconductor layer and the pillars 10 may include silicon. Alternatively, the semiconductor layer may include GaN or AlN, or one of a semiconductor material composed of IV group element semiconductors and alloys thereof and a compound semiconductor, and the pillars 10 may include silicon.

The semiconductor layer may be epitaxially grown, and at the same time, may be doped. For example, the semiconductor layer may be doped with a P-type material.

Specifically, the formation of the crystalline polyhedrons 15 by epitaxially growing the semiconductor layer may be performed using various deposition or growth methods such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and the like.

Figure 7:
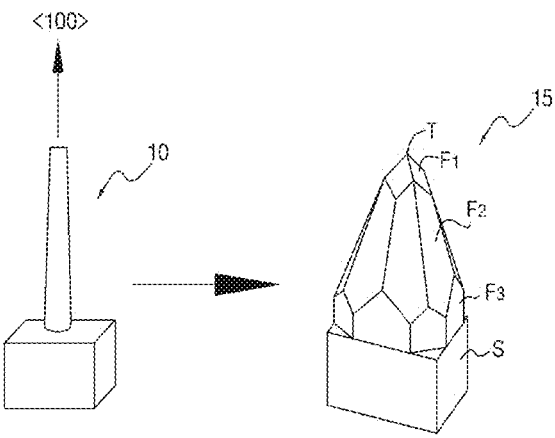
FIGS. 7, 8, and 9 are views schematically illustrating crystalline polyhedrons according to example embodiments of the present invention.
Figure 8:
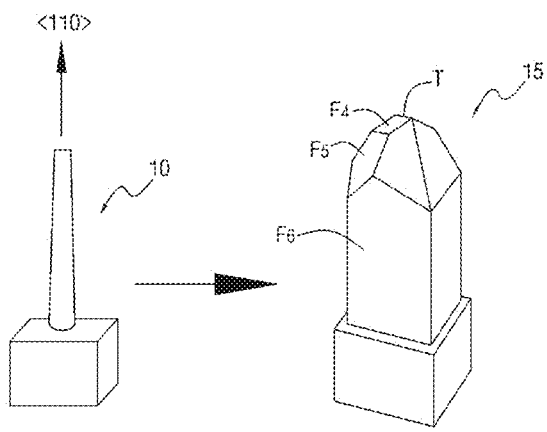
Figure 9:
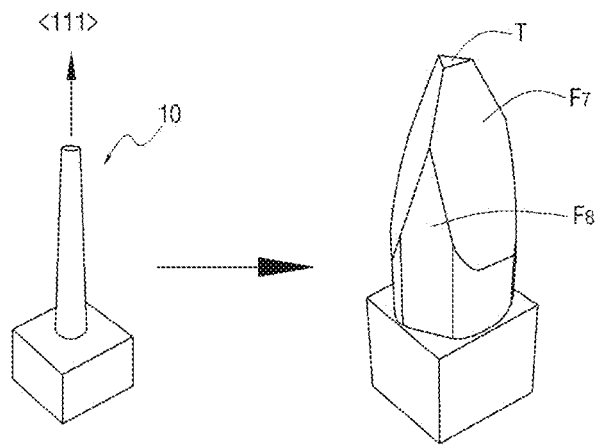

FIGS. 7, 8, and 9 are views schematically illustrating crystalline polyhedrons according to example embodiments of the present invention.

Referring to FIG. 7, a crystalline polyhedron 15 is illustrated. A silicon pillar 10 may be formed by etching a silicon substrate S grown in a <100> direction, hydrogen annealing may be optionally performed on the pillar 10, a silicon semiconductor layer may be then homoepitaxially grown on the pillar 10, and thus the crystalline polyhedron 15 may be obtained.

The crystalline polyhedron 15 may have a shape of which an upper width is smaller than a lower width. Furthermore, the crystalline polyhedron 15 may have a cone shape of which a width gradually decreases from a lower portion to an upper portion. In other words, an angle formed by each of facets of the crystalline polyhedron 15 and a surface of the substrate may be reduced toward an upper portion of the crystalline polyhedron 15. For example, the crystalline polyhedron 15 may include a first facet F3, a second facet F2, and a third facet F1 from a bottom toward a top, and an angle formed by each of the facets and the surface of the substrate may be reduced from the first facet F3 toward the second facet F2 and from the second facet F2 toward the third facet F1. For example, the third facet F1 may be a {111} facet and an angle formed by the third facet F1 and the surface of the substrate may be about 55 degrees. Also, the crystalline polyhedron 15 may include a sharp vertex T in which crystal facets, specifically four third facets F1 meet, at a top thereof.

Referring to FIG. 8, a crystalline polyhedron 15 having a different shape from that of FIG. 7 is illustrated. A silicon pillar 10 may be formed by etching a silicon substrate S grown in a <110> direction, hydrogen annealing may be optionally performed on the pillar 10, a silicon semiconductor layer may be then homoepitaxially grown on the pillar 10, and thus the crystalline polyhedron 15 may be obtained.

The crystalline polyhedron 15 may have a shape of which an upper width is smaller than a lower width. Furthermore, the crystalline polyhedron 15 may have a cone shape of which a width gradually decreases from a lower portion to an upper portion. In other words, an angle formed by each of facets of the crystalline polyhedron 15 and a surface of the substrate may be reduced toward an upper portion of the crystalline polyhedron 15. For example, the crystalline polyhedron 15 may include a first facet F6, a second facet F5, and a third facet F4 from a bottom toward a top, and an angle formed by each of the facets and the surface of the substrate may be reduced from the first facet F6 toward the second facet F5 and from the second facet F5 toward the third facet F4. For example, the third facet F4 may be a {111} facet and an angle formed by the third facet F4 and the surface of the substrate may be about 35 degrees. Also, the second facet F5 may be a {113} facet and an angle formed by the second facet F5 and the surface of the substrate may be about 65 degrees. Also, the crystalline polyhedron 15 may include a sharp edge T in which crystal facets, specifically two third facets F4 meet, at a top thereof.

Referring to FIG. 9, a crystalline polyhedron 15 having another shape is illustrated. A silicon pillar 10 may be formed by etching a silicon substrate S grown in a <111> direction, hydrogen annealing may be optionally performed on the pillar 10, a silicon semiconductor layer may be then homoepitaxially grown on the pillar 10, and thus the crystalline polyhedron 15 may be obtained.

The crystalline polyhedron 15 may have a shape of which an upper width is smaller than a lower width. Furthermore, the crystalline polyhedron 15 may have a cone shape of which a width gradually decreases from a lower portion to an upper portion. In other words, an angle formed by each of facets of the crystalline polyhedron 15 and a surface of the substrate may be reduced toward an upper portion of the crystalline polyhedron 15. For example, the crystalline polyhedron 15 may include a first facet F8 and a second facet F7 from a bottom toward a top, and an angle formed by each of the facets and the surface of the substrate may be reduced from the first facet F8 toward the second facet F7. For example, the second facet F7 may be a {111} facet and an angle formed by the second facet F7 and the surface of the substrate may be about 71 degrees. The first facet F8 may be a {311} facet and an angle formed by the first facet F8 and the surface of the substrate may be about 80 degrees. Also, the crystalline polyhedron 15 may include a plane T having a very small area in which crystal facets, specifically three second facets F7 meet, at a top thereof.

The different shapes of the crystalline polyhedrons illustrated in FIGS. 7, 8, and 9 may be caused by different crystal facets which appear on surfaces of the pillars on which etching and hydrogen annealing are performed, and different growth rates of the crystal facets during the epitaxial processes.

Figure 10:
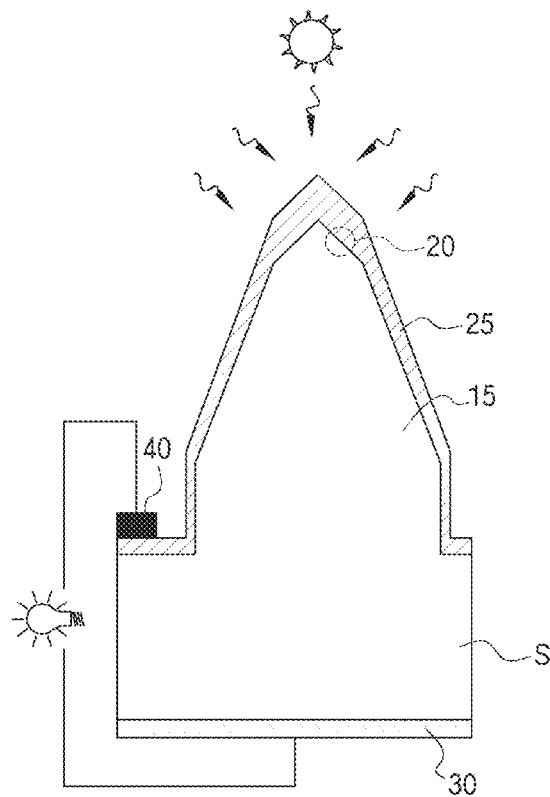
FIG. 10 is a cross-sectional view illustrating a photoelectric conversion device according to one example embodiment of the present invention.

FIG. 10 is a cross-sectional view illustrating a photoelectric conversion device according to one example embodiment of the present invention.

Referring to FIG. 10, a solar cell which is one kind of photoelectric conversion device is illustrated. The solar cell includes a polyhedron 15 disposed on a substrate S. The polyhedron 15 may be formed using the method described with reference to FIGS. 1, 3, and 5, and may be any one of the polyhedrons 15 described with reference to FIGS. 7, 8, and 9.

The polyhedron 15 may have a shape of which an upper width is smaller than a lower width. Also, the polyhedron 15 may have a structure surrounded by a plurality of different crystal facets. Furthermore, an angle formed by each of the crystal facets of the polyhedron 15 and a surface of the substrate may be reduced toward an upper portion of the polyhedron 15. Also, the polyhedron 15 may have the sharp vertex T (see FIG. 7), the sharp edge T (see FIG. 8), or the plane T (see FIG. 9) having a very small area, at a top thereof. Also, the polyhedron 15 may be a silicon polyhedron having crystallinity.

The polyhedron 15 may be a semiconductor having a first conductive type. The first conductive type may be P-type. Alternatively, a first conductive-type semiconductor layer (not illustrated) may be additionally formed on the polyhedron 15. The first conductive-type semiconductor layer may be epitaxially grown, and at the same time, may be doped with a first conductive-type dopant.

A second conductive-type semiconductor layer 25 may be epitaxially grown on the polyhedron 15. In other words, the second conductive-type semiconductor layer 25 may be an epitaxial layer, and specifically, a silicon epitaxial layer. In this case, the second conductive-type semiconductor layer 25 may also be grown, and at the same time, may be doped with a second conductive-type dopant. The second conductive type may be N-type. Alternatively, the second conductive-type semiconductor layer 25 may be formed by implanting a second conductive-type dopant into the polyhedron 15 using an ion implanting method. The second conductive-type semiconductor layer 25 may be formed to have a thickness ranging from 10 nm to 1,000 nm, and specifically, a thickness ranging from 40 nm to about 100 nm.

The thickness of the second conductive-type semiconductor layer 25 or a sum of thicknesses of the first conductive-type semiconductor layer and the second conductive-type semiconductor layer 25 when the first conductive-type semiconductor layer is formed, may be smaller than a height of the polyhedron 15. As a result, a shape of a result after the second conductive-type semiconductor layer 25 is formed may still be similar to that of the polyhedron 15.

A PN junction 20 may be formed between the polyhedron 15 or the first conductive-type semiconductor layer and the second conductive-type semiconductor layer 25.

A light-transmitting electrode layer (not illustrated) may be further formed on the second conductive-type semiconductor layer 25, but the example embodiment of the present invention is not limited thereto. The light-transmitting electrode layer may include a carbon nanotube layer, a graphene layer, a transparent conductive oxide layer, or a metal layer, and may be formed using coating, thermal deposition, electron beam deposition, or sputtering.

Then, a first electrode 30 may be formed below the substrate S and a second electrode 40 may be formed on the second conductive-type semiconductor layer 25. However, a position of the first electrode 30 is not limited thereto, and the first electrode 30 may be formed at any position as long as the first electrode 30 may be electrically connected to the polyhedron 15 or the first conductive-type semiconductor layer (not illustrated).

For example, when such a solar cell is irradiated with sunlight, the PN junction 20 absorbs photons to generate electron-hole pairs. The electron-hole pairs are separated, electrons are transferred to the second electrode 40, holes are transferred to the first electrode 30, and thus electricity is generated. In this case, due to the polyhedron 15 protruding upward, scattered reflection of incident light occurs, thereby significantly reducing reflectivity of the light, and also, a surface area of the PN junction 20 may be significantly increased. In addition, due to the shape of the polyhedron 15 of which the upper width is smaller than the lower width, the PN junction 20 positioned on the lower portion of the polyhedron 15 as well as the PN junction 20 positioned on the upper portion of the polyhedron 15 may be irradiated with light and thus photoelectric conversion efficiency may be significantly improved. Also, due to the shape of the polyhedron 15 having a small width toward an upper portion thereof, since light may be vertically incident on the PN junction 20 on the lower portion even when an angle formed by the light and the surface of the substrate is reduced, for example, even when the surface of the substrate is obliquely irradiated with light such as sunlight in the morning or evening, the photoelectric conversion efficiency may not be significantly affected by an incident angle of light.

In addition, respective facets of the polyhedron 15 may be crystal facets, the first semiconductor layer or the second semiconductor layer 25, which is epitaxially formed on the crystal facets, may also have a low defect density, and thus crystal quality may be improved. Therefore, the generation and separation of the electron-hole pairs in the PN junction 20 may be performed more efficiently.

Figure 11:
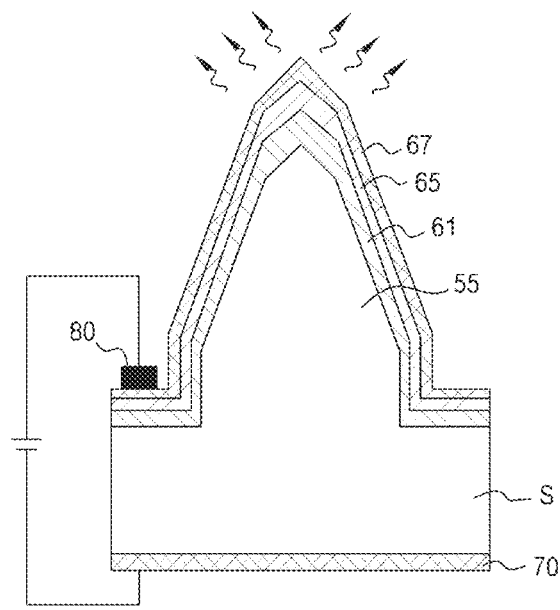
FIG. 11 is a cross-sectional view illustrating a photoelectric conversion device according to another example embodiment of the present invention.

FIG. 11 is a cross-sectional view illustrating a photoelectric conversion device according to another example embodiment of the present invention.

Referring to FIG. 11, a light-emitting diode which is another kind of photoelectric conversion device is illustrated. The light-emitting diode includes a polyhedron 55 disposed on a substrate S. The polyhedron 55 may be formed using the method described with reference to FIGS. 1, 3, and 5, and may be any one of the polyhedrons 15 described with reference to FIGS. 7, 8, and 9.

The polyhedron 55 may have a shape of which an upper width is smaller than a lower width. Also, the polyhedron 55 may have a structure surrounded by a plurality of different crystal facets. Furthermore, an angle formed by each of the crystal facets of the polyhedron 55 and a surface of the substrate may be reduced toward an upper portion of the polyhedron 55. Also, the polyhedron 55 may have the sharp vertex T (see FIG. 7), the sharp edge T (see FIG. 8), or the plane T (see FIG. 9) having a very small area, at a top thereof. Also, the polyhedron 55 may be a silicon polyhedron having crystallinity.

A device layer or a semiconductor layer may be formed on the polyhedron 55. The device layer may include a first conductive-type semiconductor layer 61, an active layer 65, and a second conductive-type semiconductor layer 67, which are sequentially stacked. The first conductive-type semiconductor layer 61, the active layer 65, and the second conductive-type semiconductor layer 67 may be, for example, compound semiconductor layers, specifically, III-V compound semiconductor layers, and more specifically, nitride-based semiconductor layers. The III-V compound semiconductor layers may include, for example, GaAlAs-based, AlGaIn-based, AlGaInP-based, AlGaInPAs-based, and GaN-based semiconductor layers.

The first conductive-type semiconductor layer 61 may be a nitride-based semiconductor layer, and may be a layer doped with an N-type dopant. For example, the first conductive-type semiconductor layer 61 may be a layer in which an $In_xAl_yGa_{1-x-y}N$ layer (where, $0 \leq x < 1$, $0 \leq y < 1$, and $0 \leq x+y < 1$) is doped with Si which is an N-type dopant. The active layer 65 may be an $In_xAl_yGa_{1-x-y}N$ layer (where, $0 \leq x < 1$, $0 \leq y < 1$, and $0 \leq x+y < 1$), and may have a single-quantum well structure or a multi-quantum well (MQW) structure. For example, the active layer 65 may have a single-quantum well structure of an InGaN layer or an AlGaN layer, or may have an MQW structure which is a multi-layer structure of InGaN and GaN layers, AlGaN and (In)GaN layers, or InAlGaN and (In)GaN layers. The second conductive-type semiconductor layer 67 may be a semiconductor layer doped with a P-type dopant. For example, the second conductive-type semiconductor layer 67 may be a layer in which an $In_xAl_yGa_{1-x-y}N$ layer (where, $0 \leq x < 1$, $0 \leq y < 1$, and $0 \leq x+y < 1$) is doped with Mg or Zn which is a P-type dopant.

When a surface of the polyhedron 55 and the first conductive-type semiconductor layer 61 have different lattice constants, a buffer layer (not illustrated) for reducing lattice mismatch between the surface of the polyhedron 55 and the first conductive-type semiconductor layer 61 may be further formed before the first conductive-type semiconductor layer 61 is formed. The buffer layer is also included within the device layer. Such a buffer layer may be an AlN layer. However, a material of the buffer layer is not limited thereto.

Each of thicknesses of the first conductive-type semiconductor layer 61, the active layer 65, and the second conductive-type semiconductor layer 67 and the total thickness of the device layer including them (61, 65, 67) may be smaller than a height of the polyhedron 55. As a result, a shape of a result after the respective layers are formed may be similar to that of the polyhedron 55.

The first conductive-type semiconductor layer 61, the active layer 65, and the second conductive-type semiconductor layer 67 may be an epitaxially grown epitaxial layer, and specifically, may be formed using various deposition or growth methods such as MOCVD, CVD, PECVD, MBE, HVPE, and the like.

A light-transmitting electrode layer (not illustrated) may be further formed on the second conductive-type semiconductor layer 67, but the example embodiment of the present invention is not limited thereto. The light-transmitting electrode layer may include a carbon nanotube layer, a graphene layer, a transparent conductive oxide layer, or a metal layer, and may be formed using coating, thermal deposition, electron beam deposition, or sputtering.

Then, a first electrode 70 may be formed below the substrate S and a second electrode 80 may be formed on the second conductive-type semiconductor layer 67. However, a position of the first electrode 70 is not limited thereto, and the first electrode 70 may be formed at any position as long as the first electrode 70 may be electrically connected to the first conductive-type semiconductor layer 61.

When a forward electric field is applied to such a light-emitting diode, electrons and holes may be injected into the active layer 65, and the electrons and holes injected into the active layer 65 may be recombined to emit light. In this case, a surface area of the active layer 65 may be significantly increased due to the polyhedron 55 protruding upward, light emitted from the active layer 65 positioned on the lower portion of the polyhedron 55 as well as light emitted from the active layer 65 positioned on the upper portion of the polyhedron 55 may be extracted to the outside due to the shape of the polyhedron 55 of which the upper width is smaller than the lower width, and thus light extraction efficiency may be significantly improved. In addition, since respective facets of the polyhedron 55 may be crystal facets, the first conductive-type semiconductor layer 61, the active layer 65, and the second conductive-type semiconductor layer 67, which are epitaxially grown on the crystal facets, may have a low defect density, and thus crystal quality may be improved. Therefore, light extraction efficiency may also be improved.

Meanwhile, a forward electric field may be concentrated on the upper portion of the polyhedron 55 due to the shape of the polyhedron 55 of which the upper width is smaller than the lower width, and thus an amount of light emitted from the active layer 65 positioned on the upper portion of the polyhedron 55 may be increased compared to an amount of light emitted from the active layer 65 positioned on the lower portion of the polyhedron 55. Thus, there may be an effect that light is concentrated on a front.

In addition, it is expected that light having various colors may be realized only by changing a voltage applied to the light-emitting diode. This is because various light-emitting colors may be realized according to an applied electric field while a current path and an equipotential plane are changed, due to structural characteristics of the polyhedron 55. It is difficult to realize in a flat light-emitting diode.

Hereinafter, experimental examples are given to aid understanding of the present invention. However, the following experimental examples are provided only to aid understanding of the present invention, and the present invention is not limited thereto.

Manufacturing Example 1: Crystalline Polyhedron Manufacturing

A silicon substrate grown in a <100> direction was etched using RIE to form silicon pillars. Next, after isotropic dry etching was again performed on the silicon pillars to make inclined surfaces on side surfaces of the silicon pillars, hydrogen annealing was performed on the substrate on which the silicon pillars were formed at a temperature of 1,050° C. and a pressure of 40 Torr for about 10 minutes, and edges of the silicon pillars were rounded. Then, the substrate on which the silicon pillars having rounded edges were formed was loaded into an epitaxial reactor, deposition was performed at a temperature of 1,050° C. and a pressure of 60 Torr for about 5 minutes while flowing dichlorosilane ($SiH_2Cl_2$; DCS) of 370 sccm, HCl of 110 sccm, diborane ($B_2H_6$; 1% balanced in $H_2$) of 110 sccm, and $H_2$ of 20 slm into the reactor, and a semiconductor layer was epitaxially grown on the silicon pillars.

Manufacturing Example 2: Crystalline Polyhedron Manufacturing

A crystalline polyhedron was manufactured in the same manner as in Manufacturing Example 1 except that the crystalline polyhedron was manufactured using a silicon substrate grown in a <110> direction.

Manufacturing Example 3: Crystalline Polyhedron Manufacturing

A crystalline polyhedron was manufactured in the same manner as in Manufacturing Example 1 except that the crystalline polyhedron was manufactured using a silicon substrate grown in a <111> direction.

Figure 12:
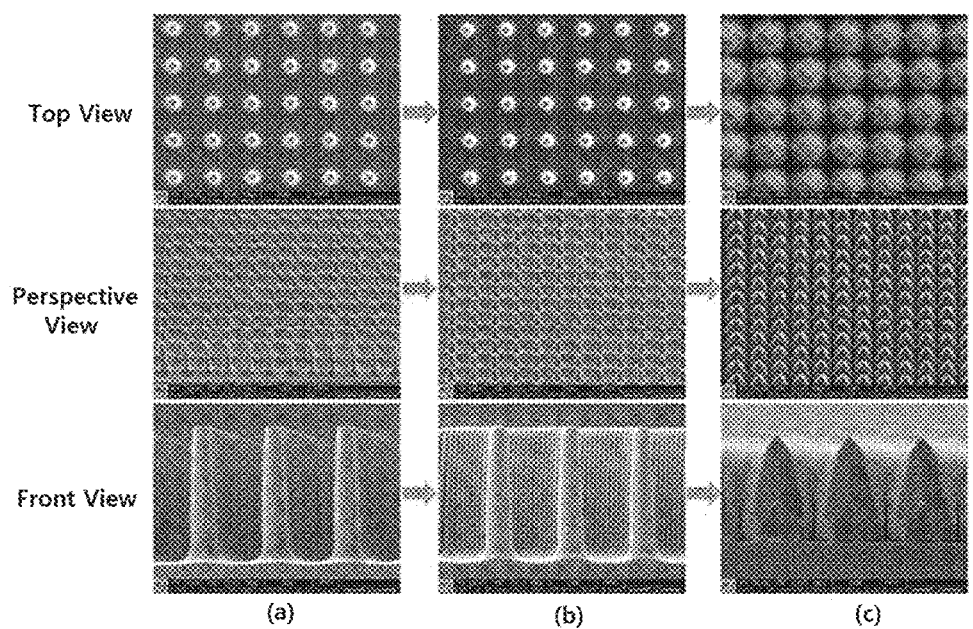
FIG. 12 shows photographs of crystalline polyhedrons obtained while a method of manufacturing a crystalline polyhedron according to Manufacturing Example 1 is performed.

FIG. 12 shows photographs of crystalline polyhedrons obtained while a method of manufacturing a crystalline polyhedron according to Manufacturing Example 1 is performed.

Referring to FIG. 12, it may be confirmed that silicon pillars having an average width of about 1 µm and an average height of about 15 µm were formed after isotropic dry etching was completed (a), it may be confirmed that edges of the silicon pillars were rounded after hydrogen annealing was performed (b), and it may be known that a crystalline polyhedron was formed after a semiconductor layer was epitaxially grown on the silicon pillars (c). A lowermost portion of the crystalline polyhedron of (c) had an average width of 7 µm and an average height of 11 µm.

Figure 13:
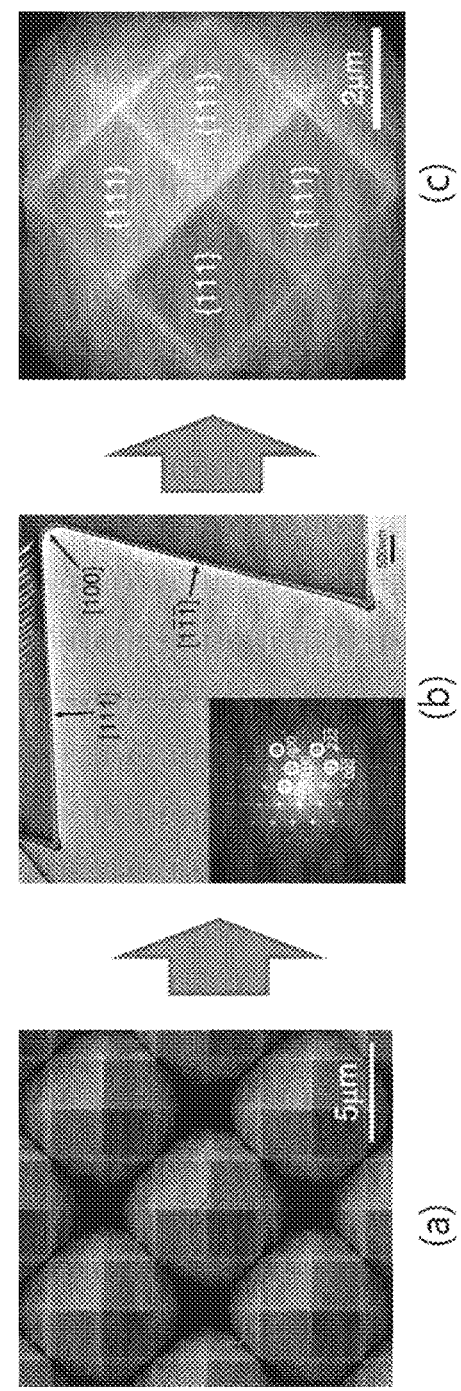
FIG. 13 shows scanning electron microscope (SEM) photographs (a, b) of the crystalline polyhedron formed according to Manufacturing Example 1 and a transmission electron microscope (TEM) photograph (c) of the crystalline polyhedron.

FIG. 13 shows scanning electron microscope (SEM) photographs (a, b) of the crystalline polyhedron formed according to Manufacturing Example 1 and a transmission electron microscope (TEM) photograph (c) of the crystalline polyhedron.

Referring to FIG. 13, as a result of TEM analysis in (b) by cutting the crystalline polyhedron along a red rim of (a), it was confirmed that a vertex has a <100> direction and all four crystal facets forming the vertex are {111} facets.

Figure 14:
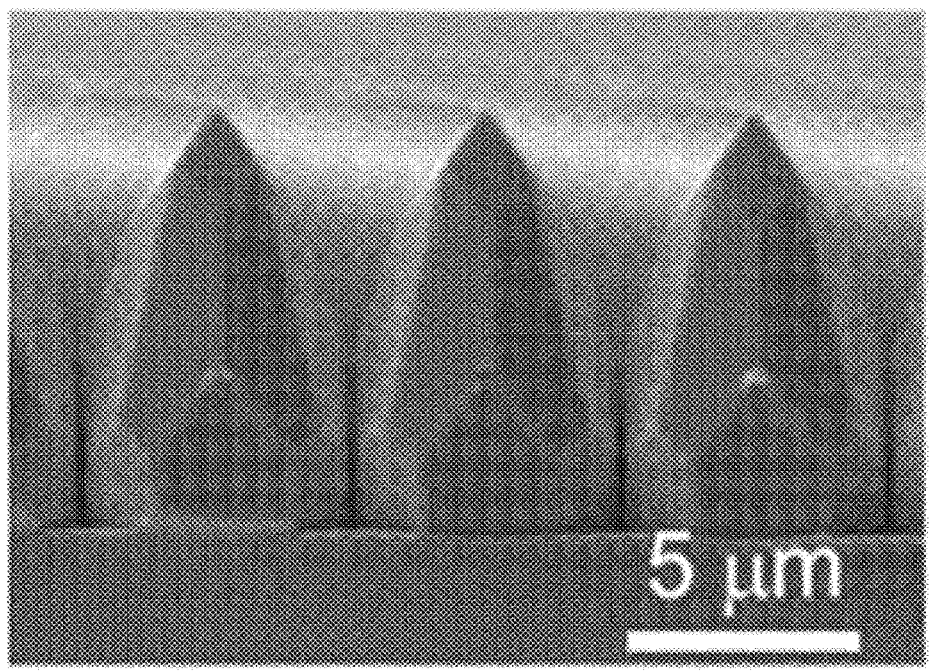
FIGS. 14, 15, and 16 are SEM photographs of crystalline polyhedrons according to Manufacturing Examples 1 to 3, respectively.
Figure 15:
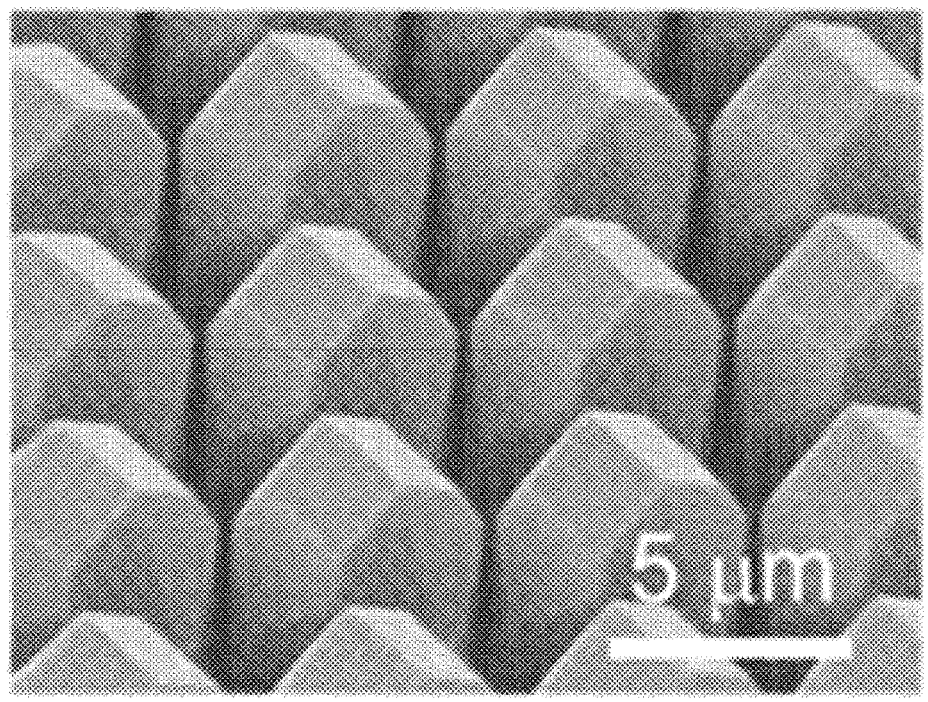
Figure 16:
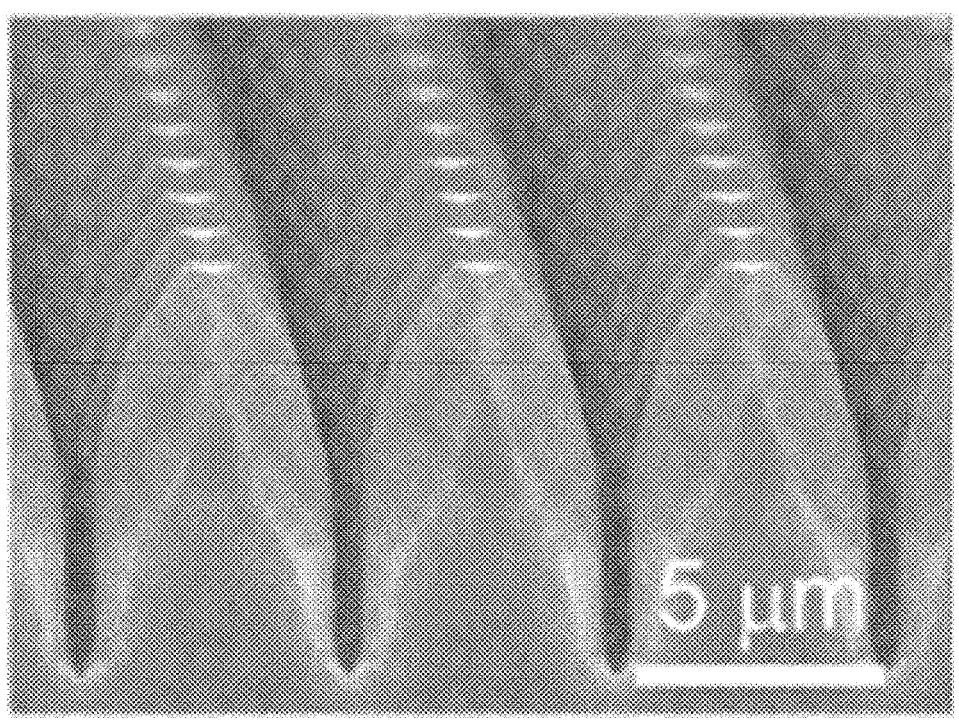

FIGS. 14, 15, and 16 are SEM photographs of crystalline polyhedrons according to Manufacturing Examples 1 to 3, respectively.

Referring to FIGS. 14, 15, and 16, it may be known that when silicon substrates have different crystal growth directions, crystalline polyhedrons having different shapes are manufactured.

Figure 17:
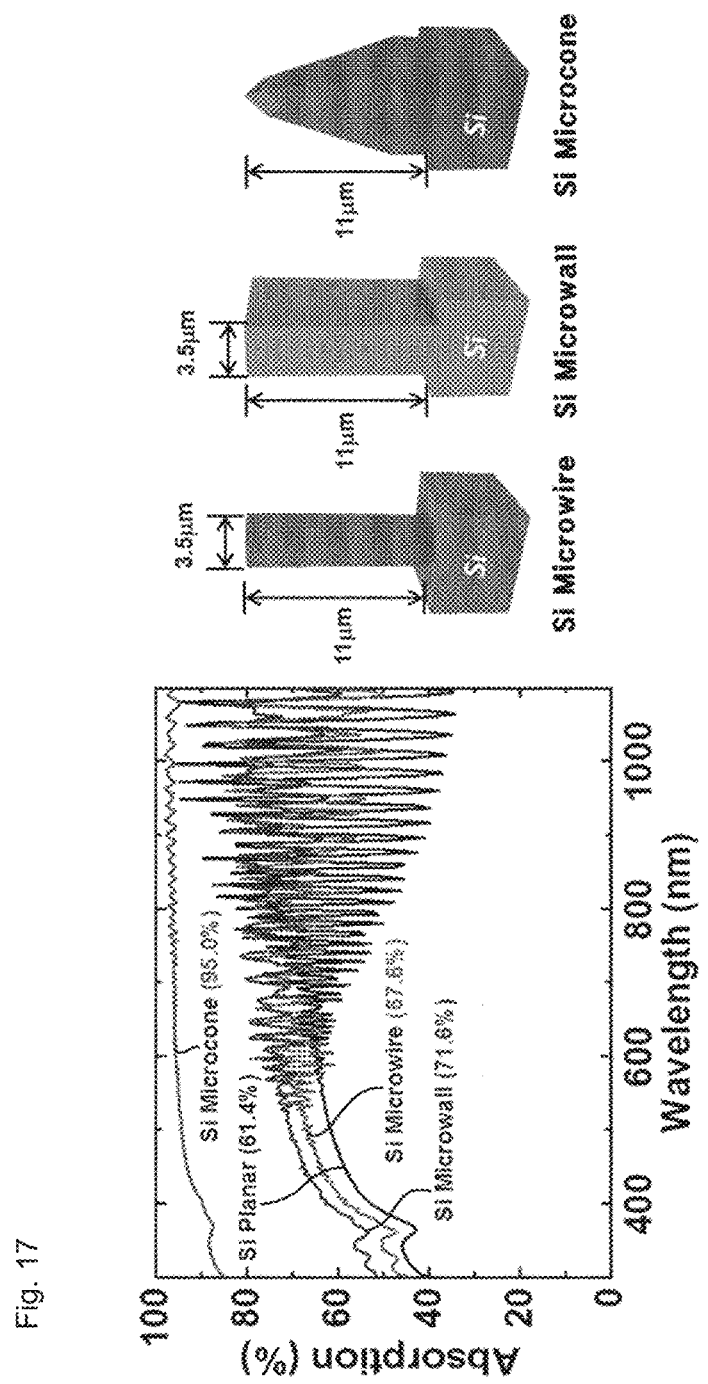
FIG. 17 is a graph illustrating light absorption efficiencies of the crystalline polyhedron formed according to Manufacturing Example 1, a cylindrical silicon pillar, a rectangular parallelepiped silicon wall, and a flat silicon substrate.

FIG. 17 is a graph illustrating light absorption efficiencies of the crystalline polyhedron according to Manufacturing Example 1, a cylindrical silicon pillar, a rectangular parallelepiped silicon wall, and a flat silicon substrate. In this case, in a state in which it was assumed that the cylindrical silicon pillar has a width of 3.5 µm and a height of 11 µm, the rectangular parallelepiped silicon wall has a width of 3.5 µm and a height of 11 µm, and the crystalline polyhedron formed according to Manufacturing Example 1 has a height of 11 µm, the light absorption efficiencies were calculated through computer simulation. In this case, it was assumed that light of AM1.5G is emitted.

Referring to FIG. 17, it may be known that the cylindrical silicon pillar (represented by Si microwire and having an absorbable surface area of 170 µm$^2$) and the rectangular parallelepiped silicon wall (represented by Si microwall and having an absorbable surface area of 203 µm$^2$) have total light absorption rates of about 67.6% and about 71.6% at a wavelength ranging from 300 nm to 1,100 nm, respectively, which are higher than a light absorption rate of 61.4% of the flat silicon substrate (having an absorbable surface area of 49 µm$^2$). It was estimated that this is because of the increase of the surface area. Meanwhile, it may be known that the crystalline polyhedron (represented by Si microcone and having an absorbable surface area of 152.1 µm$^2$) according to Manufacturing Example 1 has a total light absorption rate of about 95% at a wavelength ranging from 300 nm to 1,100 nm, which is relatively higher than that of the flat silicon substrate about 1.5 times (e.g., 95.0% (Si Microcone)/61.4% (Si Planar)≈1.55 times) and is absolutely higher than that of the flat silicon substrate about 33% or more.

Also, it may be known that the crystalline polyhedron (represented by Si microcone and having an absorbable surface area of 152.1 µm$^2$) according to Manufacturing Example 1 has a light absorption rate ranging from 1.3 to 1.4 times higher than light absorption rates of the cylindrical silicon pillar (represented by Si microwire and having an absorbable surface area of 170 µm$^2$) and the rectangular parallelepiped silicon wall (represented by Si microwall and having an absorbable surface area of 203 µm$^2$) despite the small absorbable surface area. It was estimated that this is because the crystalline polyhedrons manufactured in the present invention have a plurality of crystal facets, have an excellent light scattering effect due to a sharp shape, and have graded refractive indexes which are more complicated than other structure.

Figure 18:
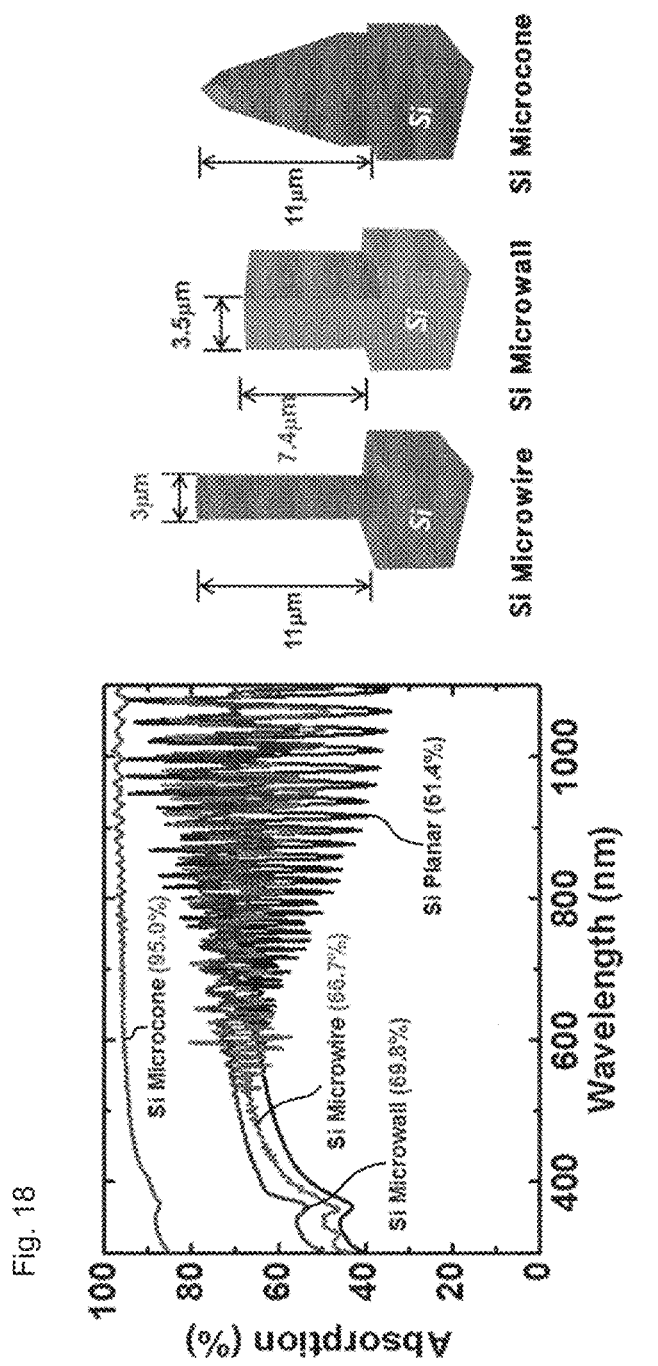
FIG. 18 is a graph illustrating the light absorption efficiencies of the crystalline polyhedron formed according to Manufacturing Example 1, the cylindrical silicon pillar, the rectangular parallelepiped silicon wall, and the flat silicon substrate.

FIG. 18 is a graph illustrating the light absorption efficiencies of the crystalline polyhedron formed according to Manufacturing Example 1, the cylindrical silicon pillar, the rectangular parallelepiped silicon wall, and the flat silicon substrate. In this case, in a state in which it was assumed that the cylindrical silicon pillar has a width of 3.5 µm and a height of 11 µm, the rectangular parallelepiped silicon wall has a width of 3.5 µm and a height of 7.4 µm, and the crystalline polyhedron formed according to Manufacturing Example 1 has a height of 11 µm, the light absorption efficiencies were calculated through computer simulation. In this case, it was assumed that light of AM1.5G is emitted.

Referring to FIG. 18, it may be known that the cylindrical silicon pillar (represented by Si microwire and having an absorbable surface area of 152.7 µm$^2$) and the rectangular parallelepiped silicon wall (represented by Si microwall and having an absorbable surface area of 152.6 µm$^2$) have total light absorption rates of about 66.7% and about 69.8% at a wavelength ranging from 300 nm to 1,100 nm, respectively, which are higher than a light absorption rate of 61.4% of the flat silicon substrate. However, it may be known that the crystalline polyhedron (represented by Si microcone and having an absorbable surface area of 152.1 µm$^2$) according to Manufacturing Example 1 has a total light absorption rate of about 95% at a wavelength ranging from 300 nm to 1,100 nm, which is significantly higher than the light absorption rates of the cylindrical silicon pillar (represented by Si microwire and having an absorbable surface area of 152.7 µm$^2$) and the rectangular parallelepiped silicon wall (represented by Si microwall and having an absorbable surface area of 152.6 μm²), and has a similar surface area thereto. It was also estimated that this is because the crystalline polyhedrons manufactured in the present invention have a plurality of crystal facets, have an excellent light scattering effect due to a sharp shape, and have graded refractive indexes which are more complicated than other structure.

Figure 19:
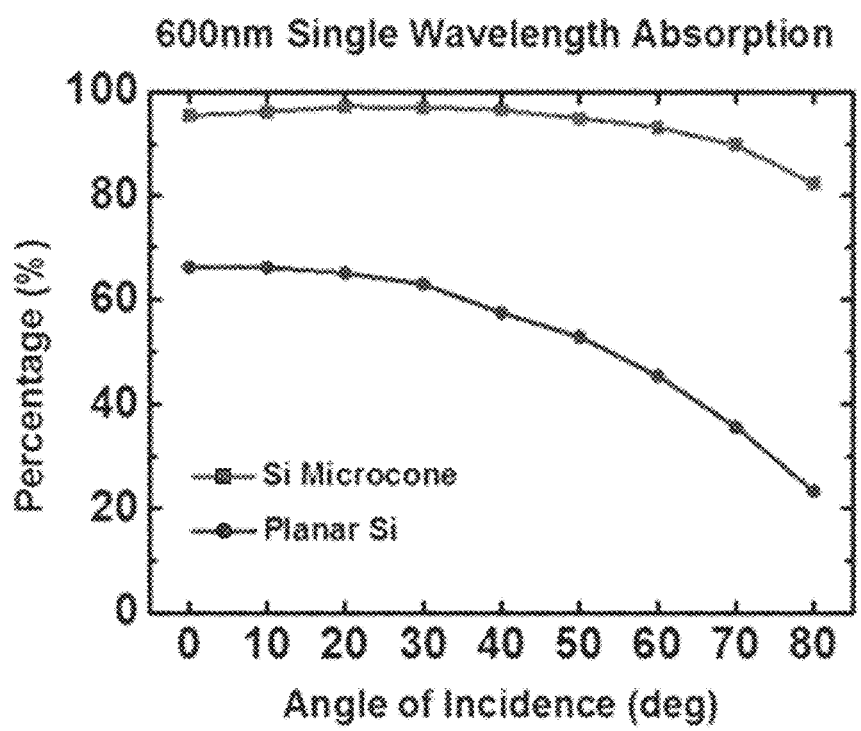
FIG. 19 is a graph illustrating absorption efficiency of the crystalline polyhedron formed according to Manufacturing Example 1 in accordance with a light radiation angle.

FIG. 19 is a graph illustrating absorption efficiency of the crystalline polyhedron formed according to Manufacturing Example 1 in accordance with a light radiation angle.

Referring to FIG. 19, in the flat silicon substrate, while light absorption efficiency is significantly decreased as an angle of incidence is increased, it was shown that the crystalline polyhedron (represented by Si microcone) according to Manufacturing Example 1 may absorb light with a substantially constant absorption rate without depending on an incident angle of a light source. In the case of a solar cell manufactured using the crystalline polyhedron, it may be shown that the light absorption rate is constant even when an angle of sun varies during daytime, in other words, even in the morning or evening.

Figure 20:
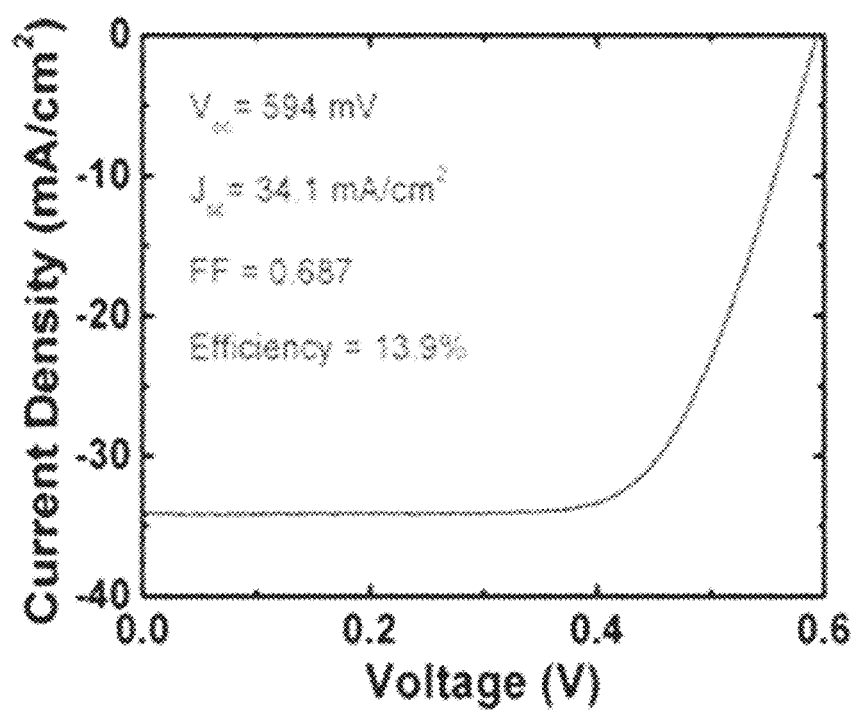
FIG. 20 is a graph illustrating current density of a solar cell manufactured using the crystalline polyhedron formed according to Manufacturing Example 1 in accordance with a voltage.

FIG. 20 is a graph illustrating current density of a solar cell manufactured using the crystalline polyhedron formed according to Manufacturing Example 1 in accordance with a voltage. In the solar cell, after an N-type semiconductor layer was formed on a P-type crystalline polyhedron formed according to Manufacturing Example 1 to have a thickness of about 100 nm, a first electrode was formed below a substrate, a second electrode was formed on the N-type semiconductor layer, and thus current density according to the voltage was obtained through experiment.

Referring to FIG. 20, an open circuit voltage $V_{oc}$ is 594 mV, a short circuit current density $J_{sc}$ is 34.1 mA/cm², a fill factor FF is 0.687, and an input power density $P_s$ is 100 mW/cm², and thus power conversion efficiency was calculated to be 13.9%. In consideration that power conversion efficiency of a flat silicon solar cell having an antireflection film is about 12.0%, it may be known that the solar cell formed on the crystalline polyhedron shows very excellent performance.

Figure 21:
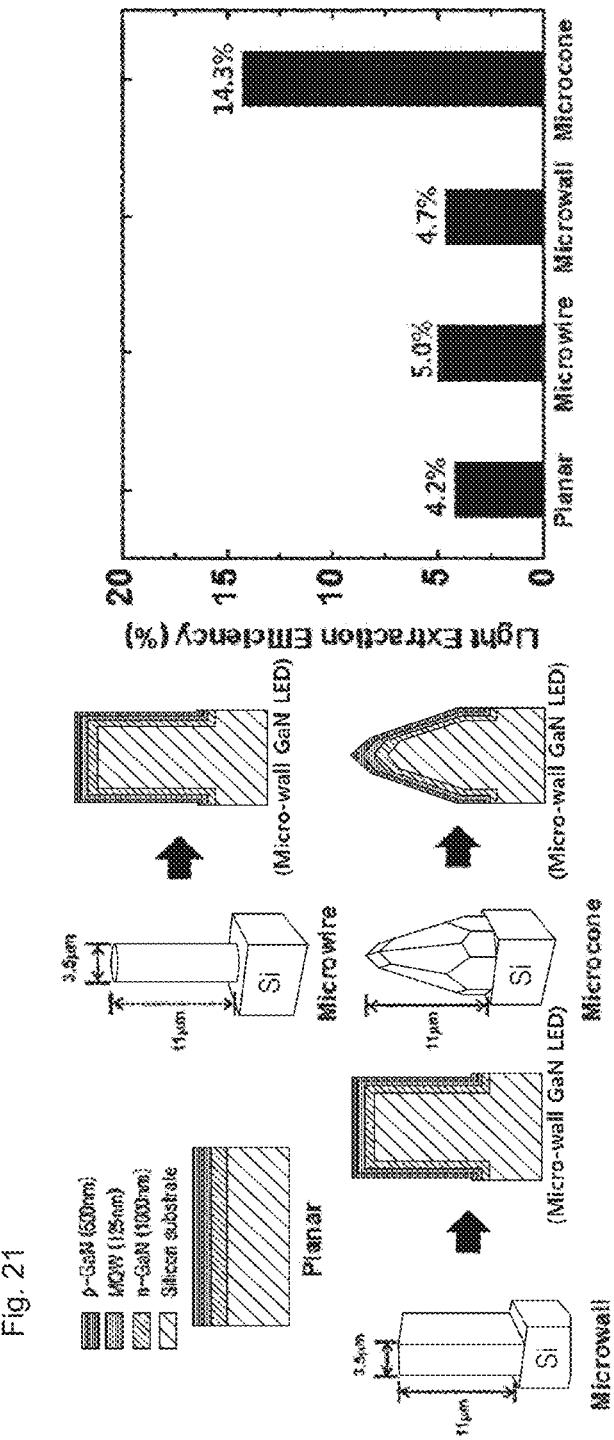
FIG. 21 is a graph for comparing light extraction efficiencies of light-emitting diodes having various shapes.

FIG. 21 is a graph for comparing light extraction efficiencies of light-emitting diodes having various shapes. In this case, light extraction efficiencies of a flat light-emitting diode (represented by planar), a silicon pillar light-emitting diode (represented by microwire), a silicon wall light-emitting diode (represented by microwall), and a crystalline polyhedron light-emitting diode (represented by microcone), which are obtained by forming an N-type GaN layer of 1,000 nm, an MQW layer of 125 nm, and a P-type GaN layer of 500 nm on a flat silicon substrate, a cylindrical silicon pillar having a width of 3.5 μm and a height of 11 μm, a rectangular parallelepiped silicon wall having a width of 3.5 μm and a height of 11 μm, and a crystalline polyhedron having a height of 11 μm formed according to Manufacturing Example 1, were calculated through computer simulation.

Referring to FIG. 21, it may be known that the light extraction efficiency of the crystalline polyhedron light-emitting diode (represented by microcone) is significantly improved compared to that of the flat light-emitting diode (represented by planar), that of the silicon pillar light-emitting diode (represented by microwire), and that of the silicon wall light-emitting diode (represented by microwall). It was estimated that this is because a unique structural shape of the crystalline polyhedron aids to emit light.

Figure 22:
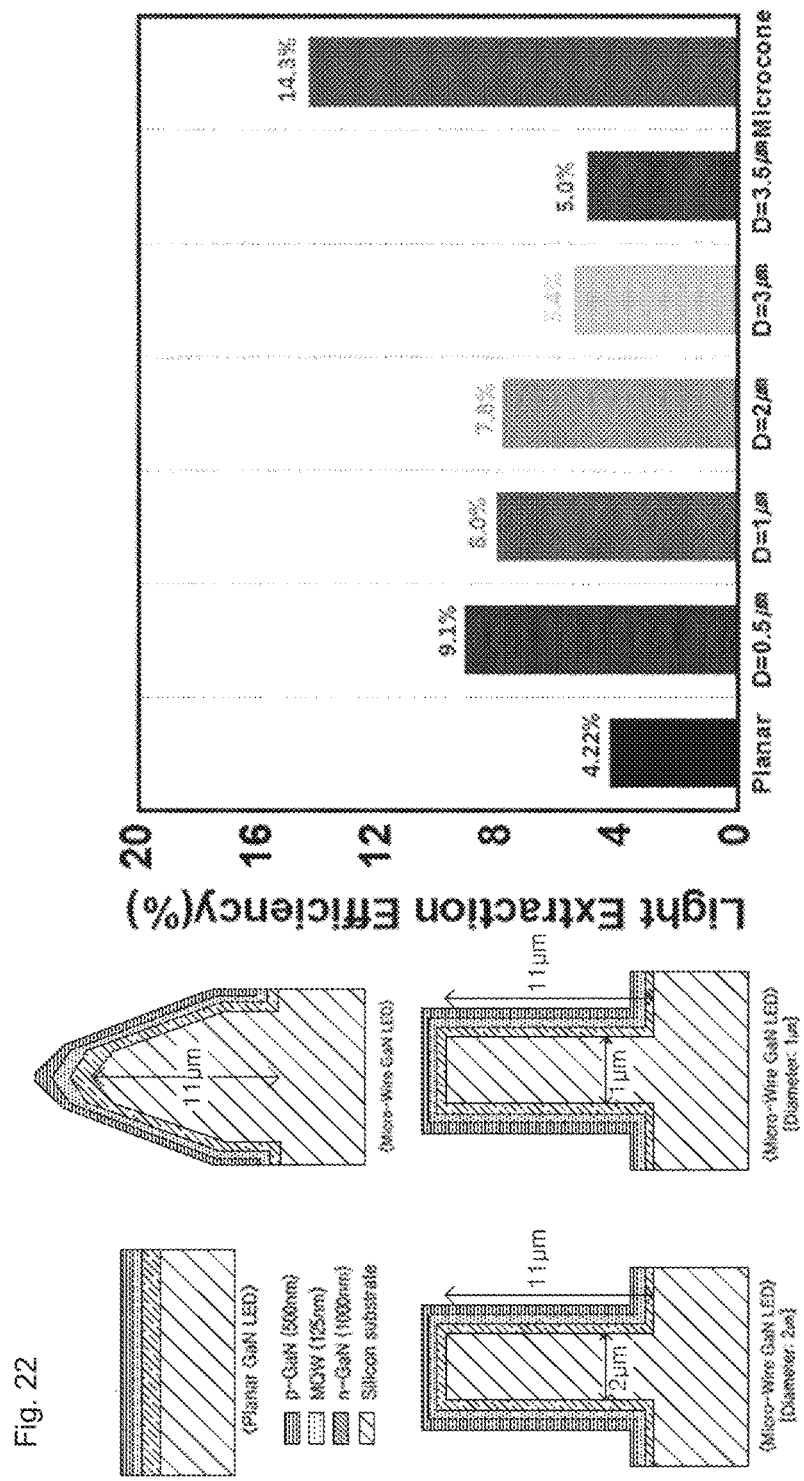
FIG. 22 is a graph for comparing light extraction efficiencies of light-emitting diodes having various shapes.

FIG. 22 is a graph for comparing light extraction efficiencies of light-emitting diodes having various shapes. In this case, light extraction efficiencies of a flat light-emitting diode (represented by planar), silicon pillar light-emitting diodes having various widths (where, D is 0.5 μm, 1 μm, 2 μm, 3 μm, and 3.5 μm), and a crystalline polyhedron light-emitting diode (represented by microcone), which are obtained by forming an N-type GaN layer of 1,000 nm, an MQW layer of 125 nm, and a P-type GaN layer of 500 nm on a flat silicon substrate, cylindrical silicon pillars having various widths ranging from 0.5 μm to 3.5 μm and a height of 11 μm, and a crystalline polyhedron having a height of 11 μm formed according to Manufacturing Example 1, were calculated through computer simulation.

Referring to FIG. 22, it might be confirmed that a maximum value of the light extraction efficiency increases as diameters of the silicon pillars in the silicon pillar light-emitting diodes decrease. However, it may be known that even a light-emitting diode having a silicon pillar having a diameter of 0.5 μm shows lower light extraction efficiency than that of the crystalline polyhedron light-emitting diode.

Figure 23:
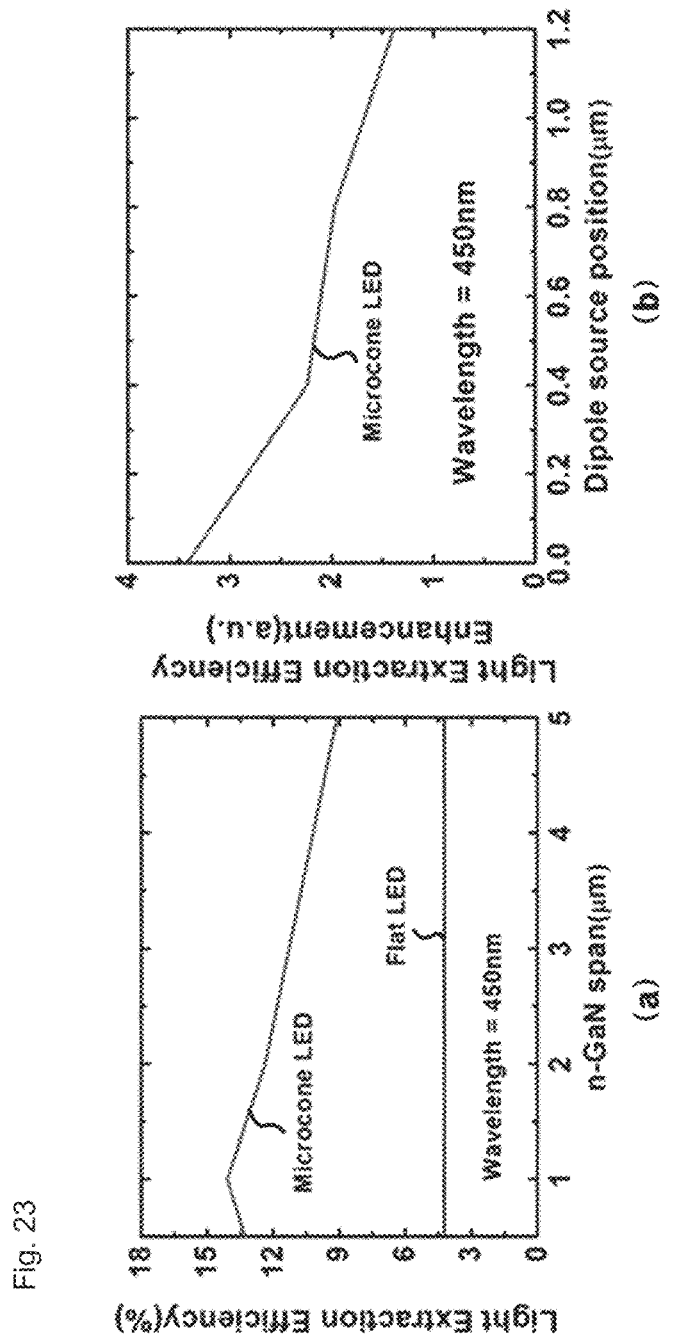
FIG. 23 shows a graph (a) illustrating light extraction efficiencies of a flat light-emitting diode and a crystalline polyhedron light-emitting diode in accordance with height variation of N-type GaN layers and a graph (b) illustrating enhancement of the light extraction efficiency of the crystalline polyhedron light-emitting diode with respect to the flat light-emitting diode in accordance with position change of a dipole source.

FIG. 23 shows a graph (a) illustrating light extraction efficiencies of a flat light-emitting diode and a crystalline polyhedron light-emitting diode in accordance with height variation of N-type GaN layers and a graph (b) illustrating enhancement of the light extraction efficiency of the crystalline polyhedron light-emitting diode with respect to the flat light-emitting diode in accordance with position change of a dipole source. In this case, light extraction efficiencies of a flat light-emitting diode (represented by planar) and a crystalline polyhedron light-emitting diode (represented by microcone), which are obtained by forming an N-type GaN layer, an MQW layer of 125 nm, and a P-type GaN layer of 500 nm on a flat silicon substrate and a crystalline polyhedron having a height of 11 μm formed according to Manufacturing Example 1, were calculated through computer simulation while changing the height of the N-type GaN layer.

Referring to FIG. 23(a), it is shown that the crystalline polyhedron light-emitting diode has a much more excellent light extraction efficiency than a general flat light-emitting diode. It is confirmed that while the flat light-emitting diode has a low light extraction efficiency of about 4.5% or less regardless of a thickness of the N-type GaN layer, the crystalline polyhedron light-emitting diode has overall high light extraction efficiency of 9% or more and has a maximum efficiency of 14% when the thickness of the N-type GaN layer is 1 μm. It is shown that the efficiency of the crystalline polyhedron light-emitting diode is greater than that of the existing flat light-emitting diode three times or more.

Referring to FIG. 23(b), it may be known that the light extraction efficiency of the crystalline polyhedron light-emitting diode may be improved as compared to the flat light-emitting diode even when a position of a dipole source is changed.

Example of Nitride Film Growth

Trimethylaluminium (TMA) gas and $NH_3$ gas, and trimethylgallium (TMG) gas and $NH_3$ gas, which are precursor gases, were supplied onto the crystalline silicon polyhedron formed according to Manufacturing Example 1, an AlN and GaN multi-buffer layer of about 500 nm (i.e., a bottom region was an AlN buffer layer of 20 nm) was formed using MOCVD, TMG gas and $NH_3$ gas were then supplied thereto, and a GaN layer of about 1 μm was formed using MOCVD.

Comparative Example of Nitride Film Growth

A buffer layer and a GaN layer were formed using the same method as that of the nitride film growth example except that a [111] silicon substrate was used instead of the crystalline silicon polyhedron.

Figure 24:
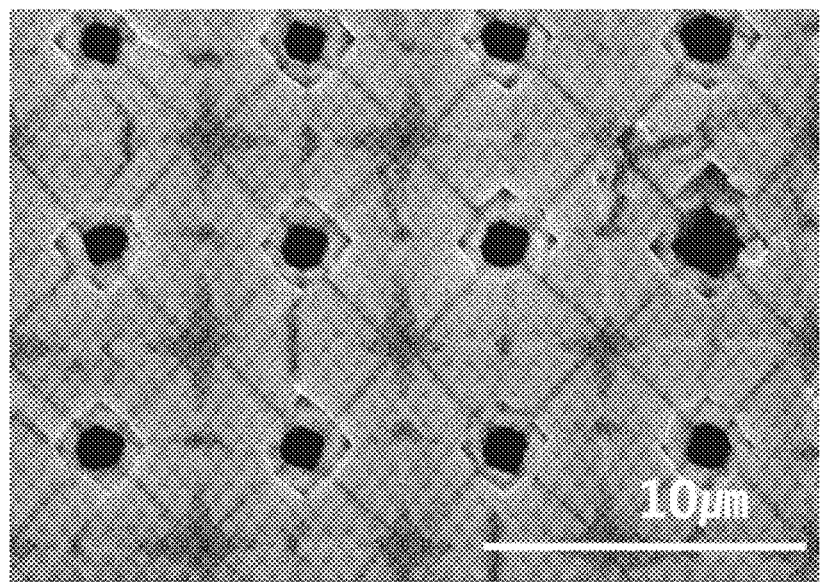
FIGS. 24, 25, and 26 are SEM photographs of an upper surface, inclined upper surface, and cross section of a specimen according to a nitride film growth example, respectively.
Figure 25:
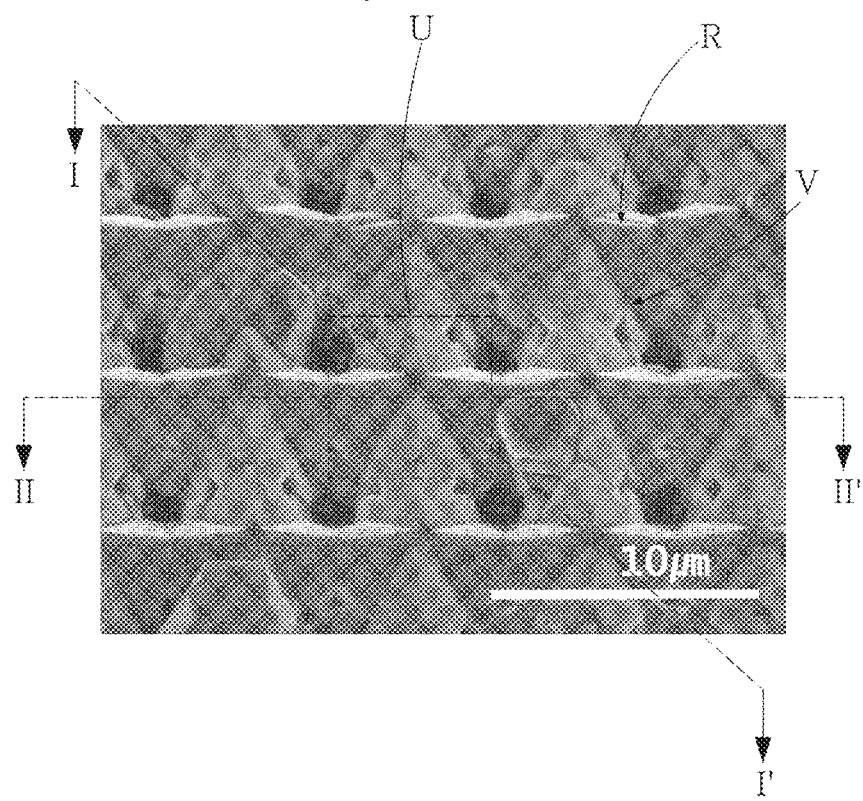
Figure 26:
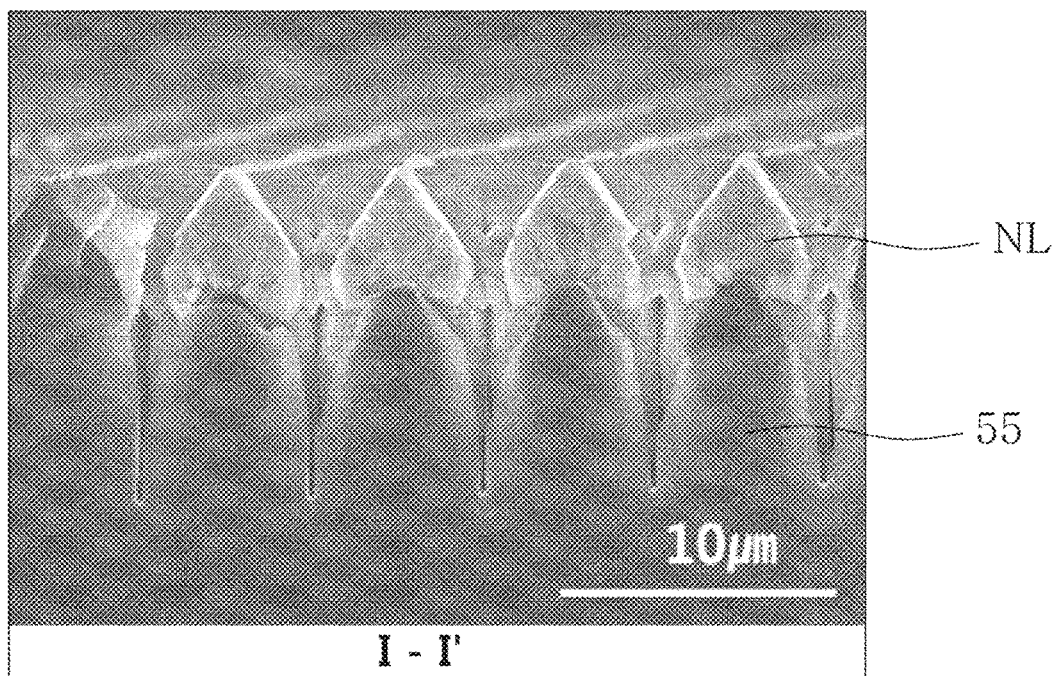
Figure 27:
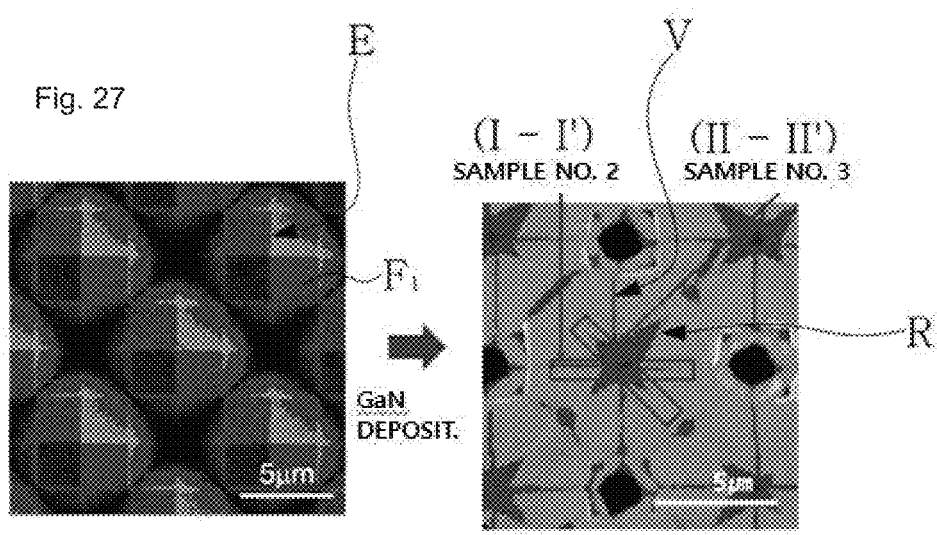
FIG. 27 illustrates an SEM photograph of an upper surface of a crystalline polyhedron before forming a nitride film and an SEM photograph of an upper surface of a specimen after growing the nitride film.

FIGS. 24, 25, and 26 are SEM photographs of an upper surface, inclined upper surface, and cross section of a specimen according to the nitride film growth example, respectively. FIG. 27 illustrates an SEM photograph of an upper surface of a crystalline polyhedron before forming a nitride film and an SEM photograph of an upper surface of a specimen after growing the nitride film. FIG. 26 is a cross-sectional view taken along line I-I' of FIG. 25.

Referring to FIGS. 24, 25, 26, and 27, it may be known that a nitride film NL is mainly formed on the upper portion of the crystalline polyhedron 55, specifically, on a {111} facet F1 (see FIG. 13) of the crystalline polyhedron (in FIG. 26). That is, it may be known that the nitride film NL is mainly grown from the {111} facet F1 of the crystalline polyhedron. Also, it may be known that the nitride film NL formed according to the nitride film growth example may have a shape of which an upper width is smaller than a lower width similarly to the crystalline polyhedron 55, and furthermore, the nitride film NL has a sharp vertex or edge at a top thereof. Specifically, the nitride film NL grown on the crystalline polyhedron 55 includes ridges R formed on the {111} facet F1 of the crystalline polyhedron, and valleys V formed on edges E between the {111} facets of the crystalline polyhedron. Also, the ridges R of the nitride film NL are connected to each other on adjacent crystalline polyhedrons 55. In this case, a surface of the nitride film which is exposed between the ridge and the valley may be a {0002} facet.

Figure 28:
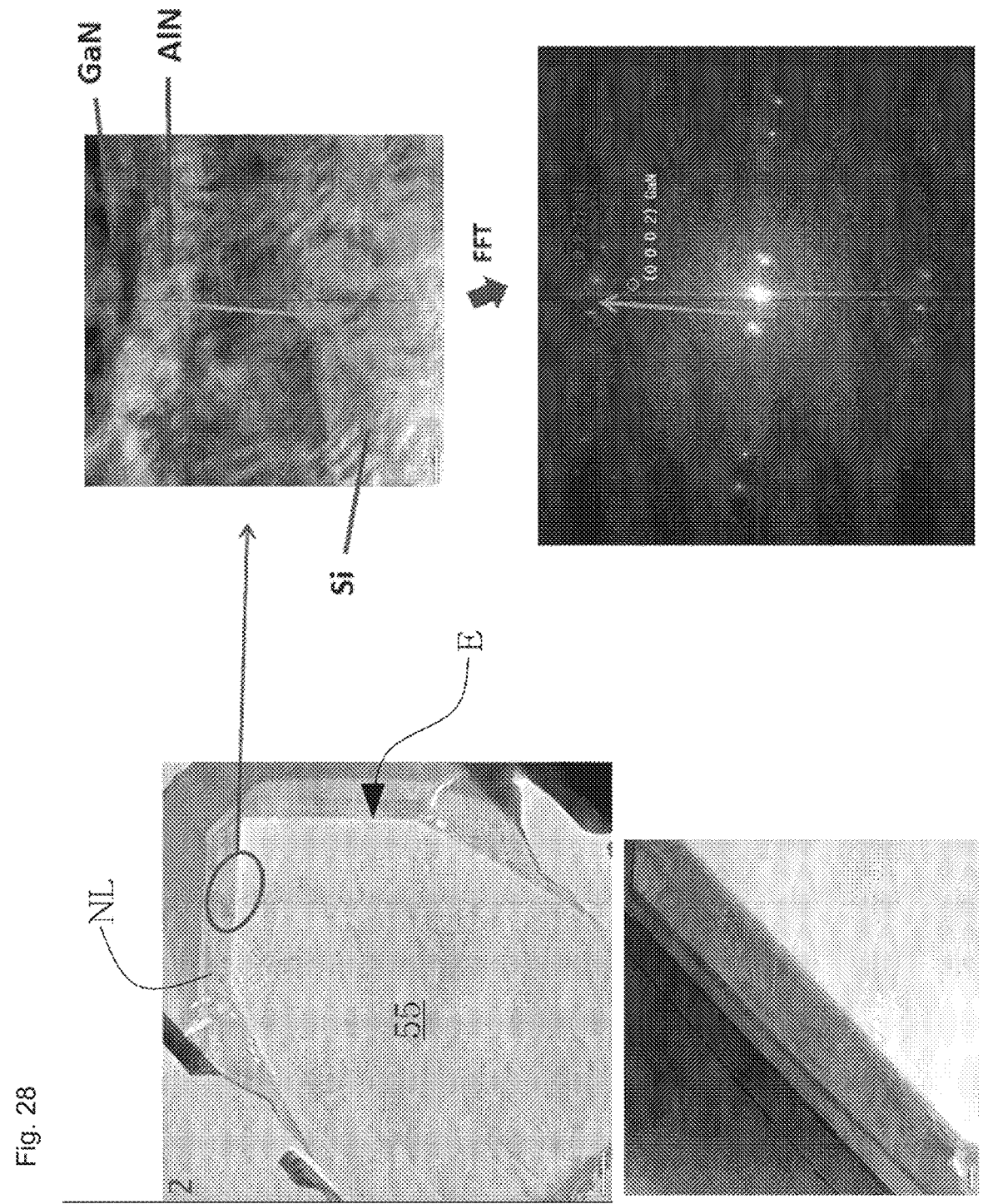
FIG. 28 illustrates a TEM photograph of a cross section and fast Fourier transform (FFT) image analysis of the specimen in a first direction according to the nitride film growth example.
Figure 29:
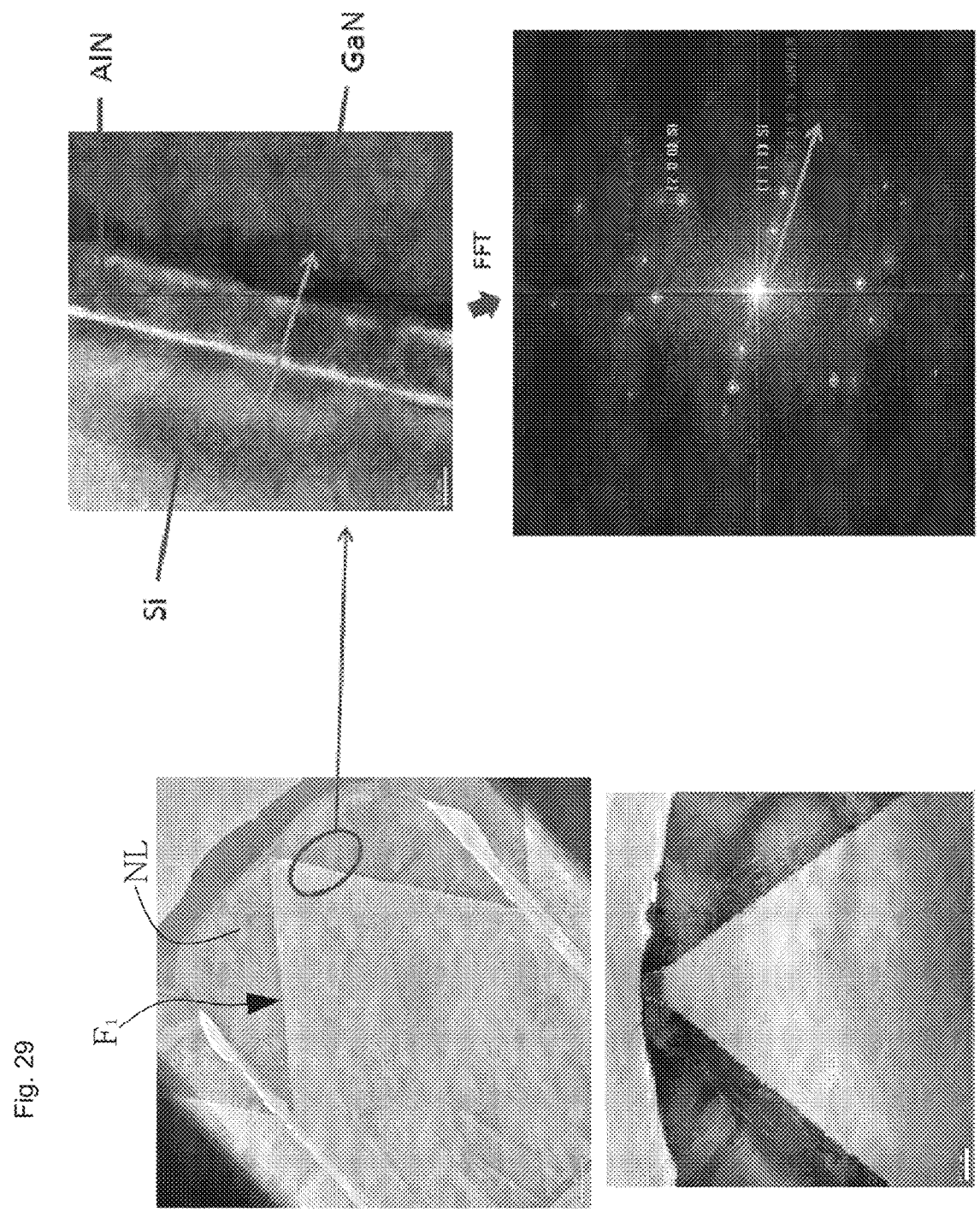
FIG. 29 illustrates a TEM photograph of a cross section and FFT image analysis of the specimen in a second direction according to the nitride film growth example.
Figure 30:
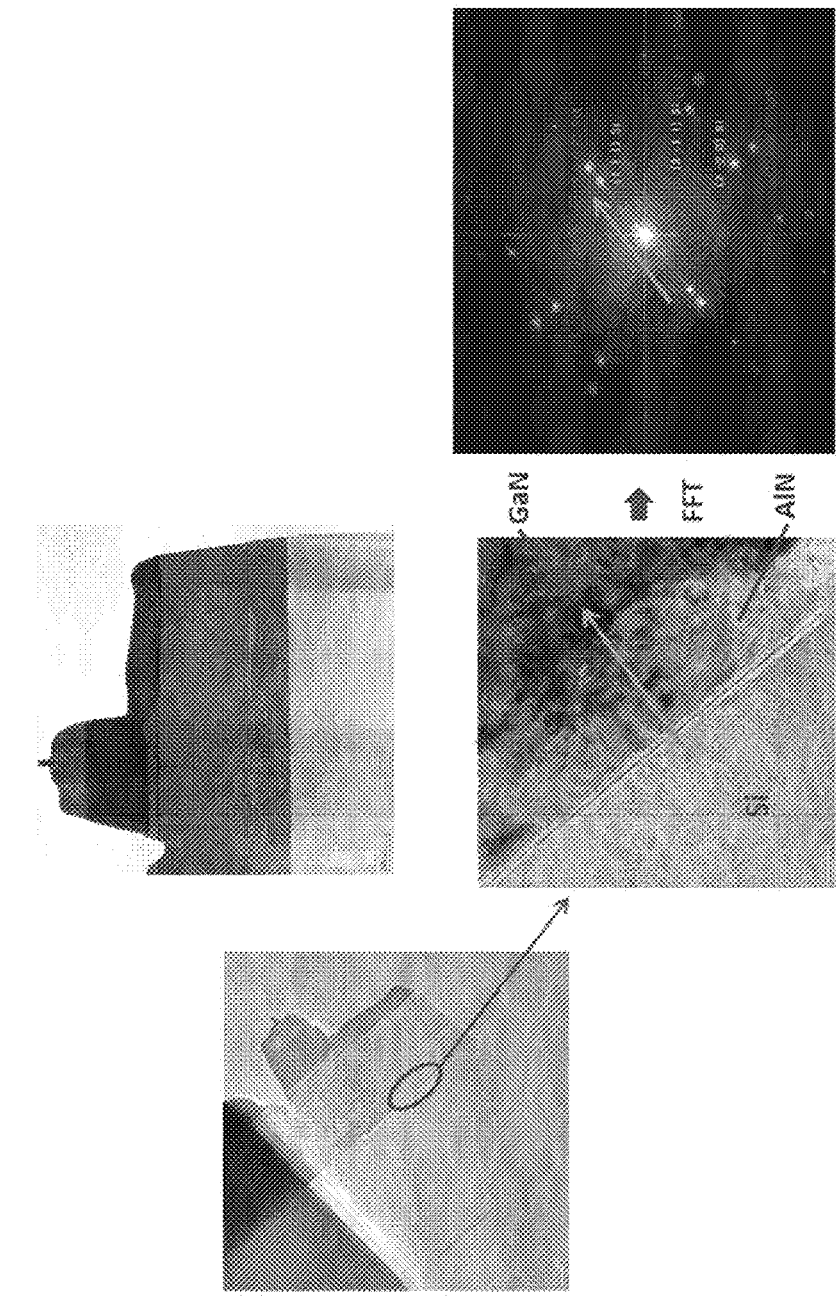
FIG. 30 illustrates a TEM photograph of a cross section and FFT image analysis of the specimen according to a nitride film growth comparative example.

FIG. 28 illustrates a TEM photograph of a cross section and a fast Fourier transform (FFT) image analysis of the specimen in a first direction according to the nitride film growth example, FIG. 29 illustrates a TEM photograph of a cross section and FFT image analysis of the specimen in a second direction according to the nitride film growth example, and FIG. 30 illustrates a TEM photograph of a cross section and FFT image analysis of the specimen according to a nitride film growth comparative example. In this case, the first direction is a direction of line I-I' of FIG. 25 or FIG. 27 and the second direction is a direction of line II-II' of FIG. 25 or FIG. 27.

Referring to FIG. 28, it may be known that a multi-buffer layer (represented by AlN) and a GaN layer, which are a nitride film NL, were sequentially formed on the edge E in which adjacent {111} facets of the crystalline polyhedron 55 meet, the multi-buffer layer has a thickness of about 0.2 μm, and the GaN layer has a thickness of about 0.4 μm. Also, it may be known that the GaN layer is grown in a <0002> direction. Meanwhile, here, the surface of the nitride film NL formed on the edge E in which the adjacent {111} facets of the crystalline polyhedron 55 meet corresponds to the valley V of FIG. 25.

Referring to FIG. 29, it may be known that a multi-buffer layer (represented by AlN) and a GaN layer, which are a nitride film NL, were sequentially formed on the {111} facets F1 of the crystalline polyhedron 55, the multi-buffer layer has a thickness of about 0.6 μm, and the GaN layer has an average thickness of about 1 μm (or a maximum height of 1.7 μm). Also, it may be known that the GaN layer is grown in a <0002> direction. Meanwhile, here, the surface of the nitride film NL formed on the {111} facets F1 of the crystalline polyhedron 55 corresponds to the ridge R of FIG. 25.

Referring to FIG. 30, it may be known that a nitride film formed on a [111] silicon substrate having a flat plate shape includes a multi-buffer layer (represented by AlN) and a GaN layer, the multi-buffer layer has a thickness of about 0.6 μm, and the GaN layer has a thickness of about 1 μm. Also, it may be known that the GaN layer is grown in a <0002> direction.

The following Table 1 illustrates total threading dislocation densities (TDD) obtained from a cross section of the specimen according to the nitride film growth example cutting in a first direction (i.e., the cross section illustrated in FIG. 28), a cross section of the specimen according to the nitride film growth example cutting in a second direction (i.e., the cross section illustrated in FIG. 29), and a cross section of the specimen according to the nitride film growth comparative example (i.e., the cross section illustrated in FIG. 30).

TABLE 1

|  | Total Threading Dislocation Density (TDD) | TDD Reduction Compared To Nitride Film Growth Comparative Example |
| --- | --- | --- |
| Cross Section Of Specimen According To Nitride Film Growth Example Cutting In First Direction (i.e., Cross Section illustrated in FIG. 28) | $7.78 \times 10^8$ cm$^{-2}$ | 0.69 |
| Cross Section Of Specimen According To Nitride Film Growth Example Cutting In Second Direction (i.e., Cross Section illustrated in FIG. 29) | $3.4 \times 10^8$ cm$^{-2}$ | 0.30 |
| Cross Section Of Specimen According To Nitride Film Growth Comparative Example (i.e., Cross Section illustrated in FIG. 30) | $1.125 \times 10^9$ cm$^{-2}$ | 1 |

Referring to Table 1, it may be known that the total TDD of the nitride film formed on the crystalline silicon polyhedron is very significantly decreased to a range ranging from 0.3 times to 0.69 times as compared to the nitride film formed on the [111] silicon substrate having a flat plate shape, and thus a high-quality nitride film is formed on the crystalline silicon polyhedron.

Figure 31:
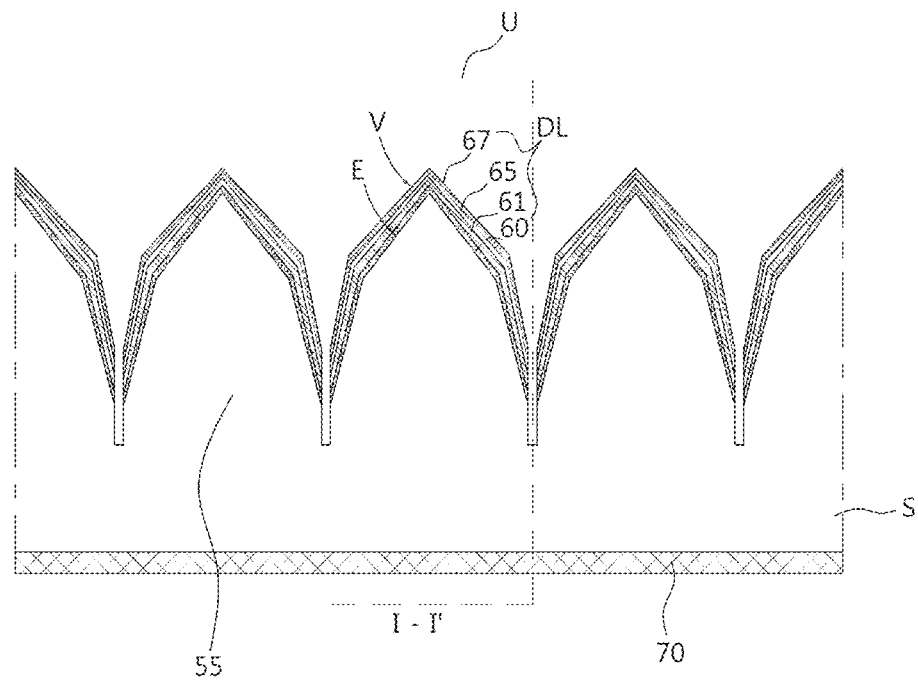
FIGS. 31 and 32 are cross-sectional views illustrating photoelectric conversion devices according to another example embodiment of the present invention.
Figure 32:
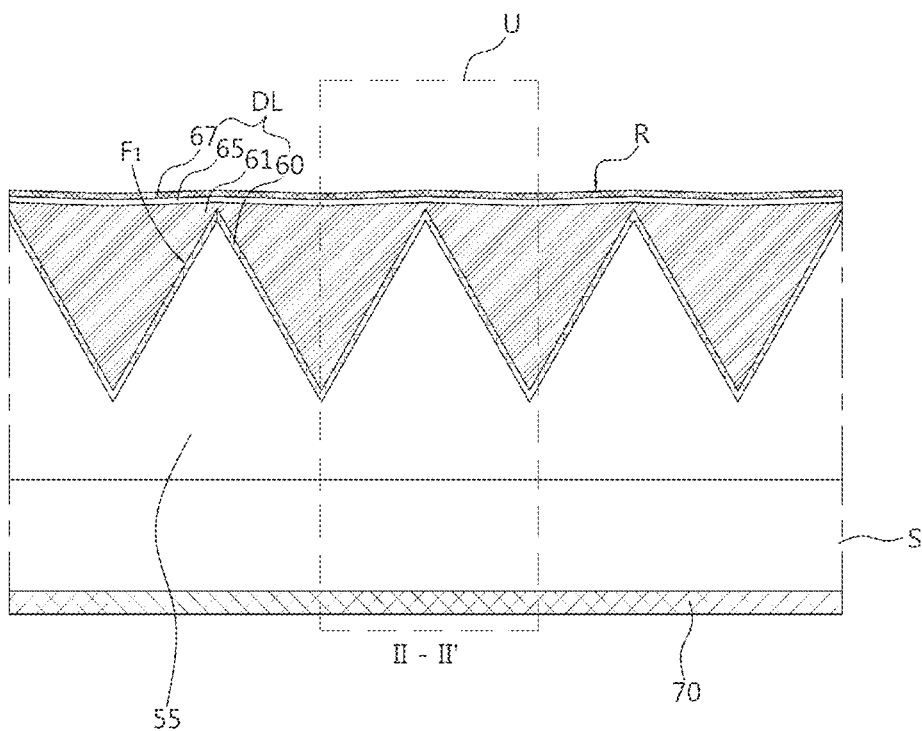
Figure 33:
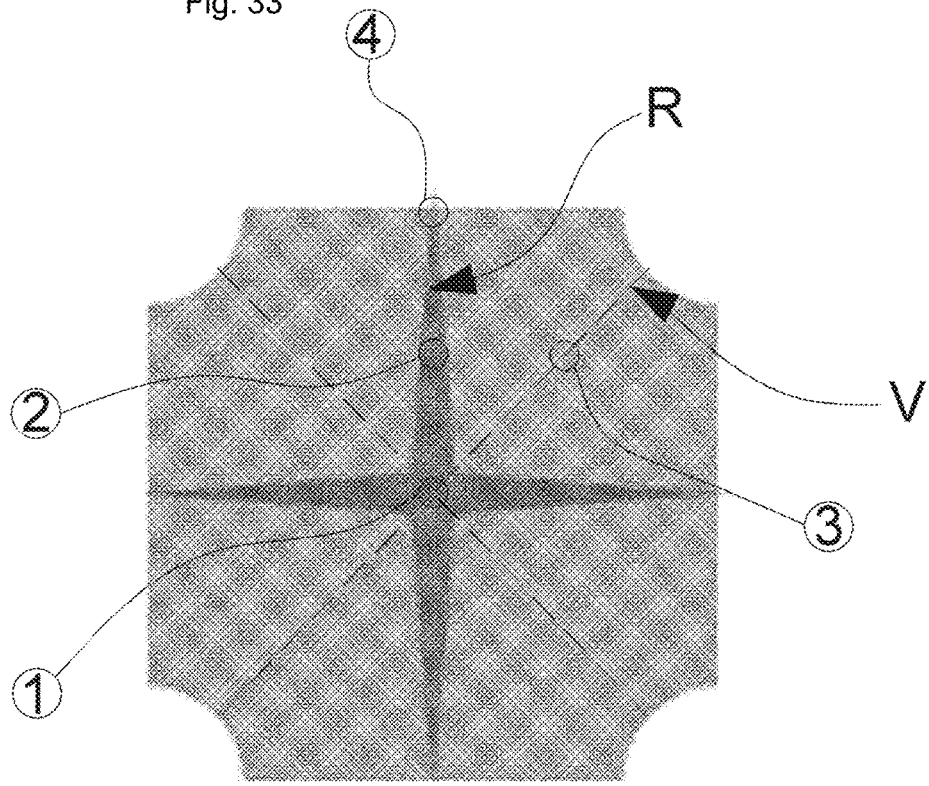
FIG. 33 is a plan view schematically illustrating an upper surface of a unit cell U illustrated in FIG. 25.

FIGS. 31 and 32 are cross-sectional views illustrating photoelectric conversion devices according to another example embodiment of the present invention. In this case, the cross-sectional views of FIGS. 31 and 32 may correspond to cross-sectional views taken along lines I-I' and II-II' of FIG. 25. Also, FIG. 33 is a plan view schematically illustrating an upper surface of a unit cell U illustrated in FIG. 25. The photoelectric conversion device according to the present example embodiment may be similar to the photoelectric conversion device described with reference to FIG. 11 except for the following description.

Referring to FIGS. 31, 32, and 33, a light-emitting diode which is another type of photoelectric conversion device is illustrated. The light-emitting diode includes a polyhedron 55 disposed on a substrate S. The polyhedron 55 may be formed using the method described with reference to FIGS. 1, 3, and 5, may be the polyhedron 15 described with reference to FIG. 7, but the present invention is not limited thereto, and the polyhedron 55 may be the polyhedron described with reference to FIGS. 8 and 9.

A device layer DL may be formed on the polyhedron 55. The device layer DL may include a buffer layer 60, a first conductive-type semiconductor layer 61, an active layer 65, and a second conductive-type semiconductor layer 67, which are sequentially stacked. The first conductive-type semiconductor layer 61, the active layer 65, and the second conductive-type semiconductor layer 67 may be, for example, compound semiconductor layers, specifically, III-V compound semiconductor layers, and more specifically, nitride-based semiconductor layers. The III-V compound semiconductor layers may be, for example, GaAlAs-base, AlGaIn-based, AlGaInP-based, AlGaInPAs-based, GaN-based semiconductor layers.

The first conductive-type semiconductor layer 61 may be a nitride-based semiconductor layer, and a layer doped with an N-type dopant. For example, the first conductive-type semiconductor layer 61 may be a layer in which an $In_xAl_yGa_{1-x-y}N$ layer (where, $0 \leq x<1$, $0 \leq y<1$, and $0 \leq x+y<1$) is doped with Si which is an N-type dopant. The active layer 65 may be an $In_xAl_yGa_{1-x-y}N$ layer (where, $0 \leq x<1$, $0 \leq y<1$, and $0 \leq x+y<1$), and may have a single-quantum well structure or a MQW structure. For example, the active layer 65 may have a single-quantum well structure of an InGaN layer or an AlGaN layer, or may have an MQW structure which is a multi-layer structure of InGaN and GaN layers, AlGaN and (In)GaN layers, or InAlGaN and (In)GaN layers. The second conductive-type semiconductor layer 67 may be a semiconductor layer doped with a P-type dopant. For example, the second conductive-type semiconductor layer 67 may be a layer in which an $In_xAl_yGa_{1-x-y}N$ layer (where, $0 \leq x<1$, $0 \leq y<1$, and $0 \leq x+y<1$) is doped with Mg or Zn which is a P-type dopant.

When a surface of the polyhedron 55 and the first conductive-type semiconductor layer 61 have different lattice constants, the buffer layer 60 may be a layer for reducing lattice mismatch between the surface of the polyhedron 55 and the first conductive-type semiconductor layer 61, and such a buffer layer may be an AlN layer, specifically, an AlN and GaN multi-buffer layer. However, a material of the buffer layer is not limited thereto.

The device layer DL may have a shape similar to that of each of the nitride films described with reference to FIGS. 24, 25, 26, and 27. Specifically, it may be known that the device layer DL may have a shape of the polyhedron, of which an upper width is smaller than a lower width, similarly to that of the polyhedron 55, and the device layer DL may have a sharp vertex or edge at a top thereof. Specifically, when the polyhedron 55 is the polyhedron described with reference to FIG. 7, the device layer DL grown on the polyhedron 55 may include ridges R formed on {111} facets F1 of the polyhedron, and valleys V formed on edges E between the {111} facets of the polyhedron. Also, the ridges R of the device layer DL may be connected to each other on adjacent polyhedrons 55. Meanwhile, at least the first conductive-type semiconductor layer 61 may be a layer grown in a [0002] direction.

Then, a first electrode 70 may be formed below the substrate S and a second electrode (not illustrated) may be formed on the second conductive-type semiconductor layer 67.

When a forward electric field is applied to such a light-emitting diode, electrons and holes may be injected into the active layer 65, and the electrons and holes injected into the active layer 65 may be recombined to emit light. In this case, a surface area of the active layer 65 may be significantly increased due to the polyhedron 55 protruding upward, light emitted from the active layer 65 positioned on the lower portion of the polyhedron 55 as well as light emitted from the active layer 65 positioned on the upper portion of the polyhedron 55 may be extracted to the outside due to the shape of the polyhedron 55 of which the upper width is smaller than the lower width, and thus light extraction efficiency may be significantly improved. In addition, since respective facets of the polyhedron 55 may be crystal facets, the first conductive-type semiconductor layer 61, the active layer 65, and the second conductive-type semiconductor layer 67, which are epitaxially grown on the crystal facets, may have a low defect density, and thus crystal quality may be improved. Therefore, light extraction efficiency may also be improved.

Meanwhile, a forward electric field may be concentrated on the upper portion of the polyhedron 55 due to the shape of the polyhedron 55 of which the upper width is smaller than the lower width, and thus an amount of light emitted from the active layer 65 positioned on the upper portion of the polyhedron 55 may be increased compared to an amount of light emitted from the active layer 65 positioned on the lower portion of the polyhedron 55. Thus, there may be an effect that light is concentrated on a front.

In addition, it is expected that light having various colors may be realized only by changing a voltage applied to the light-emitting diode. This is because various light-emitting colors may be realized according to an applied electric field while a current path and an equipotential plane are changed, due to structural characteristics of the polyhedron 55. Therefore, it is difficult to realize in a flat light-emitting diode.

The following Table 2 illustrates light extraction efficiencies of the light-emitting diodes illustrated with reference to FIGS. 31, 32, and 33. In this case, the buffer layer 60 was an AlN and GaN multi-buffer layer, the first conductive-type semiconductor layer 61 was an N-type GaN layer having a thickness ranging from about 350 nm to 2 μm according to a position thereof, the active layer 65 was an MQW layer of 100 nm, the second conductive-type semiconductor layer 67 was a P-type GaN layer of 250 nm, and thus light extraction efficiencies were calculated through computer simulation. Meanwhile, a position of a dipole was changed to a point ①, a point ②, a point ③, and a point ④ as illustrated in FIG. 33.

TABLE 2

| | Dipole Position | | | |
|---|---|---|---|---|
| | Point ① | Point ② | Point ③ | Point ④ |
| Light Extraction Efficiency (@ 450 nm) | 6.8% | 7.2% | 8.0% | 4.1% |
| Enhancement Compared To Flat Light-Emitting Diode | 2.1 times | 2.2 times | 2.5 times | 1.3 times |

Light Extraction Efficiency Of Flat Light-Emitting Diode Having The Same Layer (@ 450 nm): 3.25%

Referring to Table 2, it may be known that the light-emitting diode formed on the crystalline silicon polyhedron emits light of a wavelength of about 450 nm, that is, a wavelength of a blue light region, with light extraction efficiency ranging from about 4.1% to about 8.0%. Also, it is shown that the light extraction efficiency is much better than that of the flat light-emitting diode at a wavelength of about 450 nm. Also, it may be known that the light extraction efficiency of the light-emitting diode formed on the crystalline silicon polyhedron is improved as compared to the flat light-emitting diode even when a position of a dipole source is changed.

While the example embodiments of the present invention and their advantages have been described in detail, it should be understood that various changes, substitutions and alterations may be made herein without departing from the scope of the invention as defined by the appended claims.

The invention claimed is:

1. A photoelectric conversion device comprising:
a silicon substrate;
a crystalline silicon polyhedron grown from the substrate, wherein the polyhedron has a bottom in contact with the substrate and a tapered top; and
a semiconductor layer disposed on the polyhedron,
wherein the polyhedron consists of a plurality of planes,
wherein an angle formed by each of the planes of the polyhedron and a surface of the substrate is reduced toward the tapered top,
wherein the polyhedron has a sharp vertex, an edge, or a plane at the tapered top thereof,
wherein each of the plurality of planes is a crystal facet having single miller index, and
wherein the vertex, the edge, or the plane at the tapered top of the polyhedron exists where a plurality of crystal facets each having single miller index of {111} meets.

2. The photoelectric conversion device of claim 1, wherein the semiconductor layer is an epitaxial layer.

3. The photoelectric conversion device of claim 1, wherein a thickness of the semiconductor layer is smaller than a height of the polyhedron.

4. The photoelectric conversion device of claim 1, wherein:
the polyhedron has a first conductive type; and
the semiconductor layer has a second conductive type, and
further comprising:
a first electrode electrically connected to the first conductive-type polyhedron; and
a second electrode electrically connected to the second conductive-type semiconductor layer.

5. The photoelectric conversion device of claim 4, wherein:
the semiconductor layer is a silicon epitaxial layer.

6. The photoelectric conversion device of claim 1, wherein the semiconductor layer includes a first conductive-type semiconductor layer, an active layer, and a second conductive-type semiconductor layer, and
further comprising:
a first electrode electrically connected to the first conductive-type semiconductor layer; and
a second electrode electrically connected to the second conductive-type semiconductor layer.

7. The photoelectric conversion device of claim 6, wherein the first conductive-type semiconductor layer, the active layer, and the second conductive-type semiconductor layer are compound semiconductor layers.

8. A solar cell comprising:
a silicon substrate;
a first conductive-type crystalline silicon polyhedron grown from the substrate, wherein the polyhedron has a bottom in contact with the substrate and a tapered top;
a second conductive-type semiconductor layer disposed on the first conductive-type polyhedron;
a first electrode electrically connected to the first conductive-type polyhedron; and
a second electrode electrically connected to the second conductive-type semiconductor layer,
wherein the polyhedron consists of a plurality of planes,
wherein an angle formed by each of the planes of the polyhedron and a surface of the substrate is reduced toward the tapered top,
wherein the polyhedron has a sharp vertex, an edge, or a plane at the tapered top thereof, and
wherein each of the plurality of planes is a crystal facet having single miller index, and
wherein the vertex, the edge, or the plane at the tapered top of the polyhedron exits where a plurality of crystal facets each having single miller index of {111} meets.

9. The solar cell of claim 8, wherein:
the second conductive-type semiconductor layer is a silicon epitaxial layer.

10. The solar cell of claim 8, wherein a thickness of the second conductive-type semiconductor layer is smaller than a height of the first conductive-type polyhedron.

11. A light-emitting diode comprising:
a silicon substrate;
a crystalline silicon polyhedron grown from the substrate, wherein the polyhedron has a bottom in contact with the substrate and a tapered top;
a first conductive-type semiconductor layer, an active layer, and a second conductive-type semiconductor layer, which are sequentially disposed on the polyhedron;
a first electrode electrically connected to the first conductive-type semiconductor layer; and
a second electrode electrically connected to the second conductive-type semiconductor layer,
wherein the polyhedron consists of a plurality of planes,
wherein an angle formed by each of the planes of the polyhedron and a surface of the substrate is reduced toward the tapered top,
wherein the polyhedron has a sharp vertex, an edge, or a plane at the tapered top thereof, and
wherein each of the plurality of planes is a crystal facet having single miller index, and
wherein the vertex, the edge, or the plane at the tapered top of the polyhedron is formed where a plurality of crystal facets each having single miller index of {111} meets.

12. The light-emitting diode of claim 11, wherein the first conductive-type semiconductor layer, the active layer, and the second conductive-type semiconductor layer are compound semiconductor layers.

13. The light-emitting diode of claim 11, wherein:
the first conductive-type semiconductor layer, the active layer, and the second conductive-type semiconductor layer are epitaxial layers.

14. The light-emitting diode of claim 11, wherein a total thickness of the first conductive-type semiconductor layer, the active layer, and the second conductive-type semiconductor layer is smaller than a height of the polyhedron.

15. The photoelectric conversion device of claim 1, wherein the sharp vertex at the tapered top of the polyhedron exists is formed where four crystal facets each having single miller index of {111} meet.

16. The photoelectric conversion device of claim 1, wherein the edge at the tapered top of the polyhedron exists where two crystal facets each having single miller index of {111} meet.

17. The photoelectric conversion device of claim 1, wherein the plane at the tapered top of the polyhedron exists where three crystal facets each having single miller index of {111} meet.

* * * * *